(12) United States Patent
Ha et al.

(10) Patent No.: US 11,474,426 B2
(45) Date of Patent: Oct. 18, 2022

(54) PHOTOMASK FOR NEGATIVE-TONE DEVELOPMENT

(71) Applicant: SAMSUNG ELECTRONICS CO., LTD., Suwon-si (KR)

(72) Inventors: Soon Mok Ha, Hwaseong-si (KR); Jae-hee Kim, Yongin-si (KR); Yong-wook Lee, Yongin-si (KR); Yong-woo Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 158 days.

(21) Appl. No.: 16/564,779

(22) Filed: Sep. 9, 2019

(65) Prior Publication Data
US 2020/0089100 A1    Mar. 19, 2020

(30) Foreign Application Priority Data
Sep. 17, 2018 (KR) .................. 10-2018-0111025

(51) Int. Cl.
*G03F 1/42* (2012.01)
*G03F 1/38* (2012.01)
*H01L 21/027* (2006.01)
*G03F 7/038* (2006.01)

(52) U.S. Cl.
CPC ............ *G03F 1/42* (2013.01); *H01L 21/0274* (2013.01); *G03F 7/038* (2013.01)

(58) Field of Classification Search
None
See application file for complete search history.

(56) References Cited

U.S. PATENT DOCUMENTS

| | | | | |
|---|---|---|---|---|
| 4,405,238 A | * | 9/1983 | Grobman | G02B 5/1876 356/401 |
| 5,414,514 A | * | 5/1995 | Smith | G03F 9/7049 250/548 |

(Continued)

FOREIGN PATENT DOCUMENTS

| | | | |
|---|---|---|---|
| JP | 62-291661 | * | 12/1987 |
| JP | 63-023314 | * | 1/1988 |

(Continued)

OTHER PUBLICATIONS

Machine translation of KR 20040079752 (2004).*

(Continued)

*Primary Examiner* — Martin J Angebranndt
(74) *Attorney, Agent, or Firm* — Sughrue Mion, PLLC

(57) ABSTRACT

A photomask for negative-tone development (NTD) includes a main region, and a scribe lane region surrounding the main region and including a first lane and a second lane. The first and the second lane is provided at first opposite sides of each other with respect to the main region. The first lane includes a first sub-lane extending in a first direction and a second sub-lane that extending in the first direction. The first sub-lane includes a first dummy pattern and the second sub-lane includes a second dummy pattern. The first dummy pattern and the second dummy pattern are configured to radiate light exceeding a threshold dose of light to a first portion of a negative-tone photoresist provided under the first lane of the photomask.

19 Claims, 19 Drawing Sheets

(56) References Cited

U.S. PATENT DOCUMENTS

| | | | | |
|---|---|---|---|---|
| 5,506,684 | A * | 4/1996 | Ota | G01B 11/26 |
| | | | | 250/548 |
| 5,808,742 | A * | 9/1998 | Everett | G03F 9/70 |
| | | | | 356/401 |
| 6,093,511 | A * | 7/2000 | Tanaka | G03F 7/70641 |
| | | | | 250/491.1 |
| 6,376,139 | B1 * | 4/2002 | Fujisawa | G03F 7/70625 |
| | | | | 430/30 |
| 8,364,437 | B2 * | 1/2013 | Morinaga | G03F 9/7046 |
| | | | | 702/150 |
| 8,563,201 | B2 | 10/2013 | Hu et al. | |
| 9,040,228 | B2 | 5/2015 | Lee | |
| 2009/0142675 | A1 | 6/2009 | Kim | |
| 2018/0017873 | A1 | 1/2018 | Biafore et al. | |

FOREIGN PATENT DOCUMENTS

| | | | |
|---|---|---|---|
| JP | 05-341449 | * | 12/1993 |
| JP | 06-216207 | * | 8/1994 |
| JP | 2001-085301 | * | 3/2001 |
| JP | 2007-158189 | * | 6/2001 |
| JP | 2001-215685 | A | 8/2001 |
| JP | 2001-332556 | * | 11/2001 |
| JP | 3303077 | B2 | 7/2002 |
| JP | 2002-229180 | * | 8/2002 |
| JP | 2003-224049 | * | 8/2003 |
| JP | 2006-135047 | A | 5/2006 |
| JP | 2007-158189 | * | 6/2007 |
| KR | 10-2004-0006776 | A | 1/2004 |
| KR | 10-2004-0079752 | A | 9/2004 |
| KR | 10-2006-0039638 | A | 5/2006 |
| KR | 10-0801745 | B1 | 2/2008 |
| KR | 10-2011-0106144 | A | 9/2011 |
| TW | 296464 | * | 1/1997 |

OTHER PUBLICATIONS

Machine translation of KR 20040006776 (2004).*
Machine translation of JP 2001-085301 (2001).*
Derwent abstract of TW 296464 (Jan. 1997).*

* cited by examiner

PHOTOMASK FOR NEGATIVE-TONE DEVELOPMENT

CROSS-REFERENCE TO RELATED APPLICATION

This application claims priority from Korean Patent Application No. 10-2018-0111025, filed on Sep. 17, 2018, in the Korean Intellectual Property Office, the disclosure of which is incorporated herein by reference in its entirety.

BACKGROUND

Example embodiments of the present disclosure relate to a photomask for negative-tone development (NTD), and more particularly, to a photomask for NTD, which is designed and manufactured rapidly with low costs and has less defects.

A photomask for NTD is overlaid on a scribe lane to a surface of the scribe lane to selectively transmit light, so that only unmasked regions will be exposed to the light. In the NTD process, the photoresist material is strengthened (either polymerized or cross-linked) by light, and the developer will dissolve away only the regions that were not exposed to light, leaving behind a coating in areas where the photomask was not placed. Here, because the transmitted light may be unnecessarily scattered and adversely affect a main area adjacent to the scribe lane, there is a need to appropriately control scattering of the light into the main area.

SUMMARY

Example embodiments provide a photomask for negative-tone development (NTD), the photomask being manufactured rapidly with low costs and having less defects.

According to an aspect of an example embodiment, there is provided a photomask for a negative-tone development (NTD), the photomask including a main region; and a scribe lane region surrounding the main region and comprising a first lane and a second lane, the first and the second lane being provided at first opposite sides of each other with respect to the main region, wherein the first lane comprises a first sub-lane extending in a first direction and a second sub-lane that extending in the first direction, the first sub-lane comprises a first dummy pattern, the second sub-lane comprises a second dummy pattern, and the first dummy pattern and the second dummy pattern are configured to radiate light exceeding a threshold dose of light to a first portion of a negative-tone photoresist provided under the first lane of the photomask.

According to an aspect of an example embodiment, there is provided a photomask for negative-tone development (NTD), the photomask including a main region having a rectangular shape and a scribe lane region surrounding the main region and having a constant width, wherein the scribe lane region includes a first corner region, a second corner region, a third corner region, and a fourth corner region, the first corner region, the second corner region, the third corner region and the fourth corner region being adjacent to four corners of the main region, respectively, and wherein each of the first corner region, the second corner region, the third corner region and the fourth corner region has region light transmittance which allows light exceeding a threshold dose of light to be radiated to a negative-tone photoresist.

According to an aspect of an example embodiment, there is provided a photomask for negative-tone development (NTD), the photomask including a main region having a rectangular shape; and a scribe lane region surrounding the main region and having a constant width, wherein the scribe lane region includes a first dummy pattern region extending along an internal edge of the scribe lane region, a second dummy pattern region extending along an external edge of the scribe lane region, and a blank region arranged between the first dummy pattern region and the second dummy pattern region, and wherein one of the first dummy pattern region and the second dummy pattern region may be a line-and-space pattern and the other of the first dummy pattern region and the second dummy pattern region may be a block pattern.

BRIEF DESCRIPTION OF THE DRAWINGS

The above and/or other aspects will be more clearly understood from the following detailed description taken in conjunction with the accompanying drawings in which.

DETAILED DESCRIPTION

Figure 1:
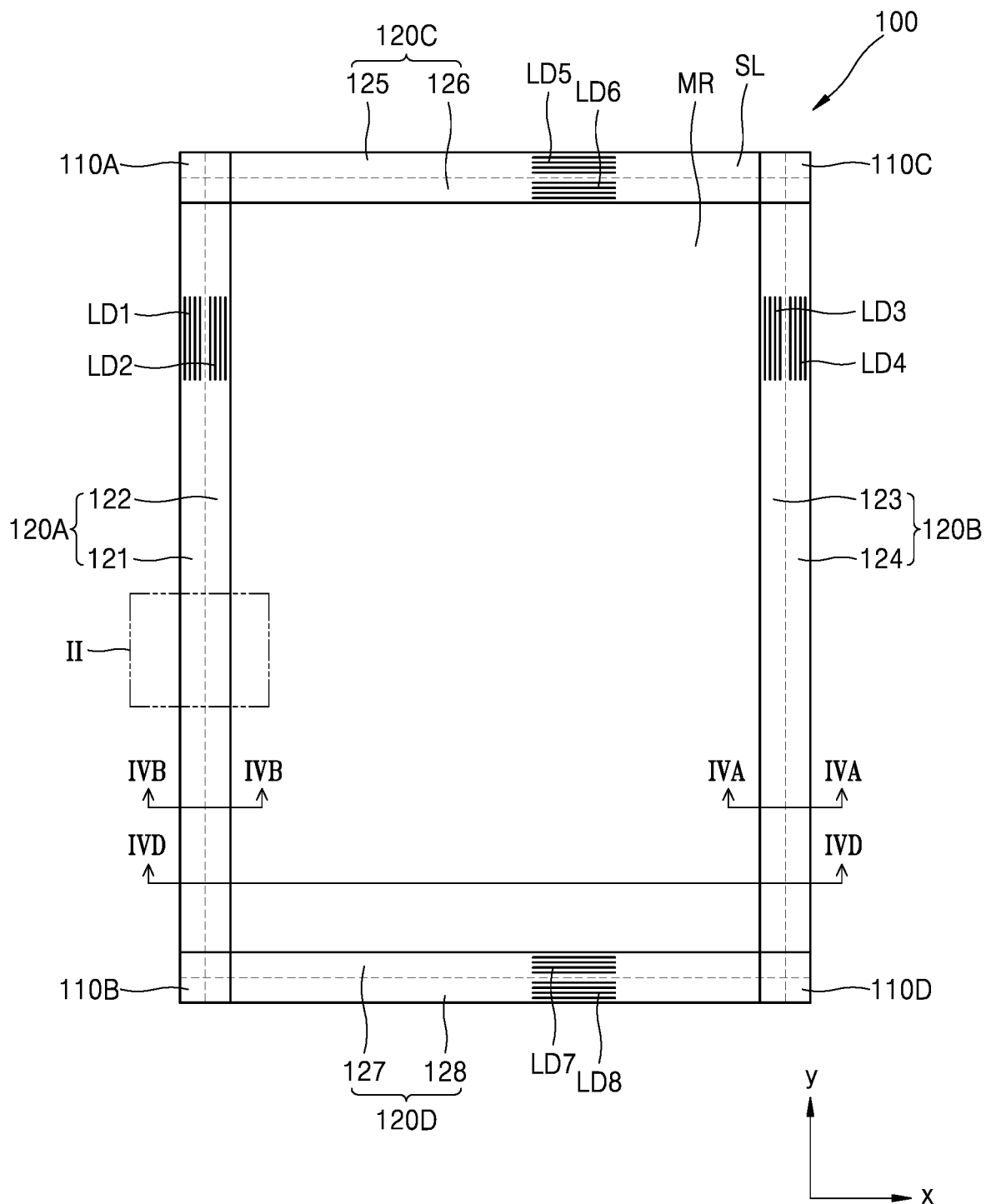
FIG. 1 is a diagram of a photomask for negative-tone development (NTD) according to an example embodiment.

Hereinafter, example embodiments will be described in detail with reference to accompanying drawings. Like reference numerals denote the same or similar elements in the drawings, and repeated descriptions thereof may be omitted.

Figure 2:
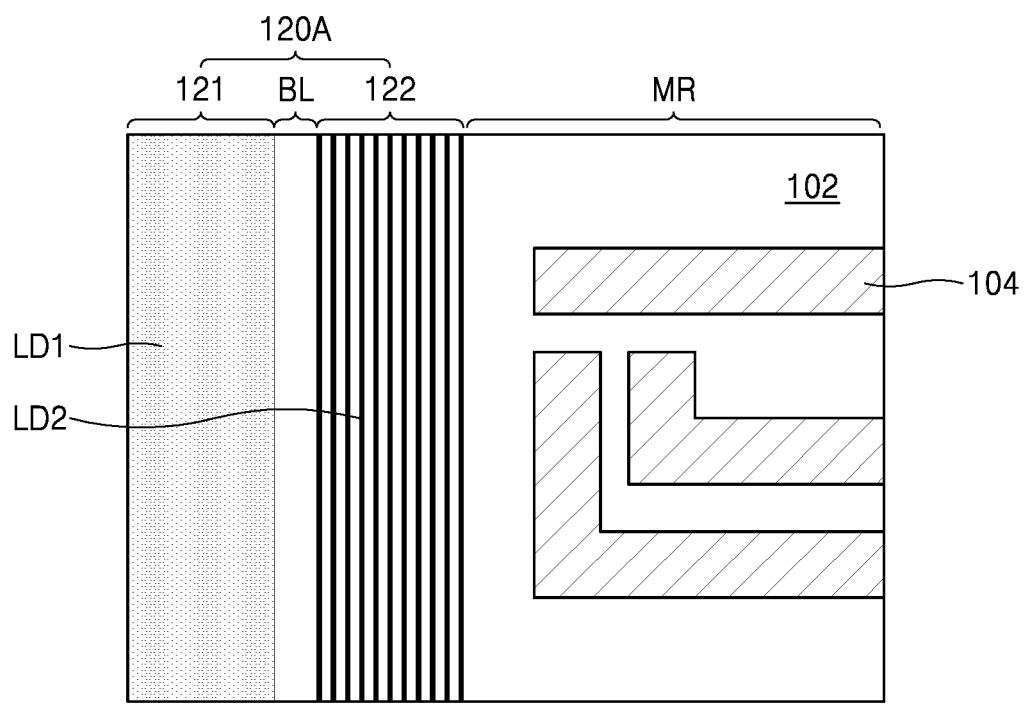
FIG. 2 is an enlarged view of a region II in FIG. 1 according to an example embodiment.

FIG. 1 is a diagram of a photomask 100 for negative-tone development (NTD) according to an example embodiment. FIG. 2 is an enlarged view of a region II in FIG. 1 according to an example embodiment.

Referring to FIG. 1 and FIG. 2, the photomask 100 for NTD may include a main region MR and a scribe lane region SL surrounding the main region MR. Both the main region MR and the scribe lane region SL are provided on a transparent substrate 102.

In the main region MR, a main pattern 104 for patterning a cell layer or for patterning a core-peri layer may be formed. However, the example embodiments are not limited thereto.

The transparent substrate 102 may include quartz, glass, or plastic. The plastic may include polyimide, polyamide, liquid crystal polyarylate, polyethylene terephthalate (PET), polyether ether ketone (PEEK), polyether sulfone (PES), polyether nitrile (PEN), polyester, polycarbonate, polyarylate, polysulfone, polyetherimide, etc.

The main pattern 104 formed on the transparent substrate 102 may include a chromium (Cr) compound, a silicon (Si) compound, a metal silicide compound, or a combination thereof. The Cr compound may be selected from chromium oxide $CrO_2$, chromium nitride (CrN), chromium carbide ($Cr_3C_2$, $Cr_7C_3$, and $Cr_{23}C_6$), chromium oxynitride (Cr(N,O), and chromium oxynitride carbide ($CrN_xO_y$). The Si compound may be selected from silicon oxide (SiO) and spin on glass (SOG). The metal silicide compound may include metal such as molybdenum (Mo), titanium (Ti), tantalum (Ta), zirconium (Zr), hafnium (Hf), niobium (Nb), vanadium (V), tungsten (W), cobalt (Co), Cr, nickel (Ni), etc., Si, and at least one element selected from oxygen (O) and nitrogen (N). In example embodiments, the metal silicide compound may be selected from TaSi, MoSi, WSi, nitrides of TaSi, MoSi and WSi, and oxynitrides of TaSi, MoSi and WSi.

In example embodiments, the main pattern 104 may include MoSiN, MoSiCN, MoSiON, MoSiCON, TaON, TION, or a combination thereof.

The scribe lane region SL may include a first lane 120A and a second lane 120B where the first lane 120A and the second lane 120B are provided at opposite sides (e.g., the left side and the right side in FIG. 1) of the main region MR. Also, the scribe lane region SL may include a third lane 120C and a fourth lane 120D where the third lane 120C and the fourth lane 120D extend in a direction perpendicular to that of the first lane 120A and the second lane 120B. As shown in FIG. 1, the third lane 120C and the fourth lane 120D are provided at opposite sides (e.g., the top side and the bottom side of FIG. 1) of the main region MR.

The first lane 120A may include a first sub-lane 121 and a second sub-lane 122 extending in a direction parallel to (i.e., in the same direction) that of the first lane 120A. The second lane 120B may include a third sub-lane 123 and a fourth sub-lane 124 extending in a direction parallel to (i.e., in the same direction) that of the second lane 120B.

The third lane 120C may include a fifth sub-lane 125 and a sixth sub-lane 126 extending in a direction parallel to (i.e., in the same direction) that of the third lane 120C. The fourth lane 120D may include a seventh sub-lane 127 and an eighth sub-lane 128 extending in a direction parallel to (i.e., in the same direction) that of the fourth lane 120D.

In FIG. 1, the first sub-lane 121 and the second sub-lane 122 may be in contact with each other and the third sub-lane 123 and the fourth sub-lane 124 may be in contact with each other, but one or more example embodiments are not limited thereto. For example, in example embodiments, as in FIG. 2, the first sub-lane 121 and the second sub-lane 122 may be spaced apart from each other with a blank region BL provided therebetween. Similarly, in example embodiments, the third sub-lane 123 and the fourth sub-lane 124 may be spaced apart from each other with a blank region BL provided therebetween.

Likewise, a blank region BL may be provided between the fifth sub-lane 125 and the sixth sub-lane 126 and may be between the seventh sub-lane 127 and the eighth sub-lane 128 to separate the respective sub-lanes.

The first sub-lane 121 may include a first dummy pattern LD1 and the second sub-lane 122 may include a second dummy pattern LD2. Here, a "dummy pattern" denotes a pattern that does not result in the same pattern on a photoresist provided under the photomask 100 after undergoing exposure and development processes. In example embodiments, the dummy pattern may have the dimensions (e.g., pitches, line widths, etc.) that are less than or equal to a required resolution so that the dummy pattern is not transferred to the photoresist.

The third sub-lane 123 may include a third dummy pattern LD3 and the fourth sub-lane 124 may include a fourth dummy pattern LD4.

The fifth sub-lane 125 may include a fifth dummy pattern LD5, the sixth sub-lane 126 may include a sixth dummy pattern LD6, the seventh sub-lane 127 may include a seventh dummy pattern LD7, and the eighth sub-lane 128 may include an eighth dummy pattern LD8.

In example embodiments, the first dummy pattern LD1 and the second dummy pattern LD2 may be symmetrical with the fourth dummy pattern LD4 and the third dummy pattern LD3, respectively, with respect to the centerline of the main region MR. In example embodiments, the fifth dummy pattern LD5 and the sixth dummy pattern LD6 may be symmetrical with the eighth dummy pattern LD8 and the seventh dummy pattern LD7, respectively, with respect to the centerline of the main region MR.

In example embodiments, the first dummy pattern LD1 and the second dummy pattern LD2 may have the same pattern as the fourth dummy pattern LD4 and the third dummy pattern LD3, respectively. In example embodiments, the fifth dummy pattern LD5 and the sixth dummy pattern LD6 may have the same pattern as the eighth dummy pattern LD8 and the seventh dummy pattern LD7, respectively.

Figure 3:
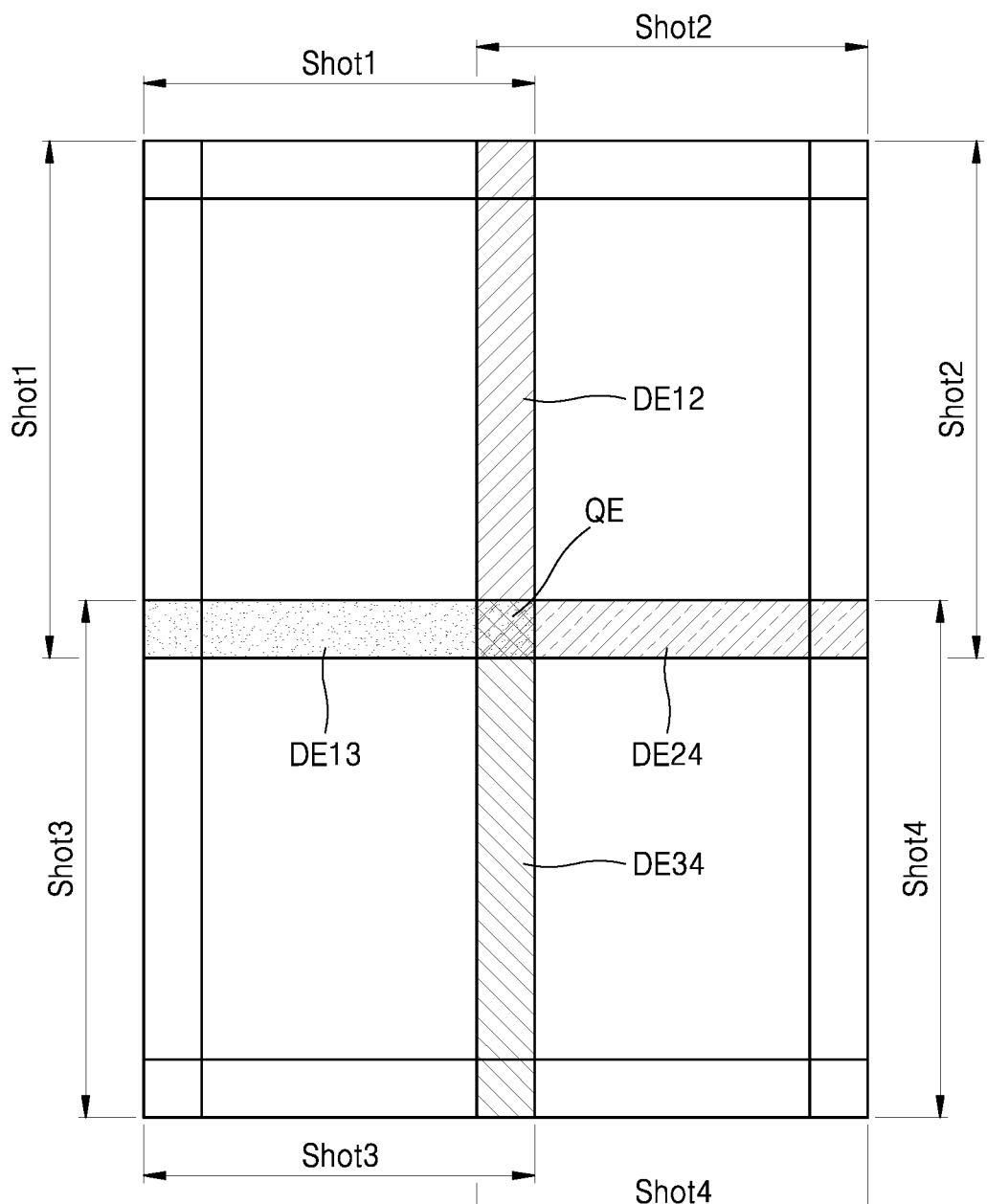
FIG. 3 is a conceptual diagram illustrating a step-and-repeat method of exposing a mask pattern on a substrate using the photomask for NTD according to an example embodiment.

FIG. 3 is a conceptual diagram illustrating a step-and-repeat method of exposing a mask pattern provided on a substrate using the photomask 100 for NTD according to an example embodiment.

Referring to FIG. 1 and FIG. 3, the photomask 100 having a mask pattern is exposed by repeatedly performing the below-described four steps according to an example embodiment. Here, the example embodiment illustrates the operation with four (4) steps of exposing the photomask, the example embodiment is not limited thereto. The first step or the first exposure (a "shot 1") and the second step or the second exposure (a "shot 2") following the shot 1 may be adjusted so that a portion of each of the scribe lane regions SL of the shot 1 and shot 2 overlap each other. In more detail, the shot 1 and the shot 2 following the shot 1 may be adjusted so that the second lane 120B of the shot 1 and the first lane 120A of the shot 2 may overlap each other on a dual overlay region DE12.

The third step or the third exposure (a "shot 3") being performed after the shot 2 and exposing a lower portion of the location where the shot 1 was performed in a y-axis direction may be adjusted to have a scribe lane region SL overlapping that of the shot 1. That is, the shot 1 and the shot 3 may be adjusted so that the fourth lane 120D of the shot 1 and the third lane 120C of the shot 3 may overlap each other in a dual overlay region DE13.

Similarly, the shot 3 and a shot 4 (the fourth step or the fourth exposure) following the shot 3 may be adjusted to have scribe lane regions SL overlapping each other. In more detail, the shot 3 and the shot 4 may be adjusted so that the second lane 120B of the shot 3 and the first lane 120A of the shot 4 may overlap each other on a dual overlay region DE34. Moreover, the shot 4 may expose on a lower portion of the location where the shot 2 is exposed in the y-axis direction, and the shot 2 and the shot 4 may be adjusted so that the fourth lane 120D of the shot 2 and the third lane 120C of the shot 4 may overlap each other on a dual overlay region DE24.

When the exposure as described by the above four-step operations (i.e., shot 1, shot 2, shot 3 and shot 4), a quadruple overlay region QE may be formed where the dual overlay region DE12, the dual overlay region DE34, the dual overlay region DE13 and the dual overlay region DE24 overlap one another.

In the above-described operation, light for the exposure is radiated once to the main region MR, while the light is radiated twice on the dual overlay regions DE12, DE13, DE24, and DE34 and radiated four times at the quadruple overlay region QE.

Figure 4A:
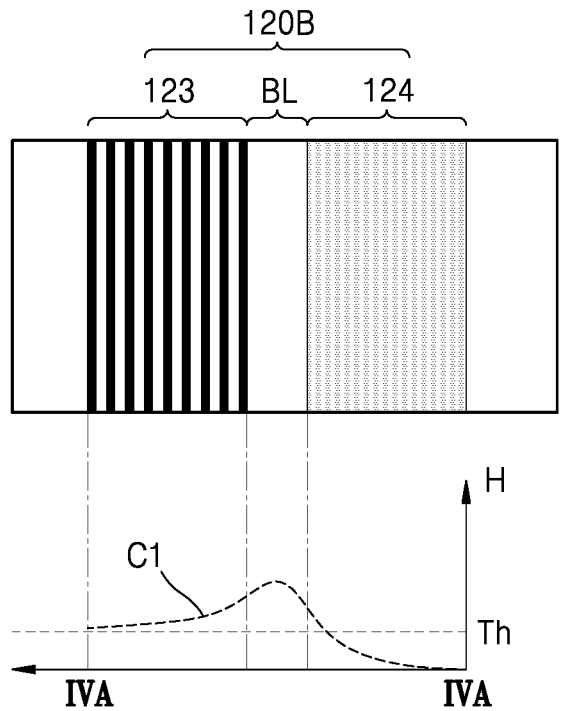
FIG. 4A is a diagram illustrating an exposure amount of a second lane along line IVA-IVA of FIG. 1.

FIG. 4A is a diagram illustrating an exposure amount of a second lane 120B along line IVA-IVA based on the first shot described above.

Figure 4B:
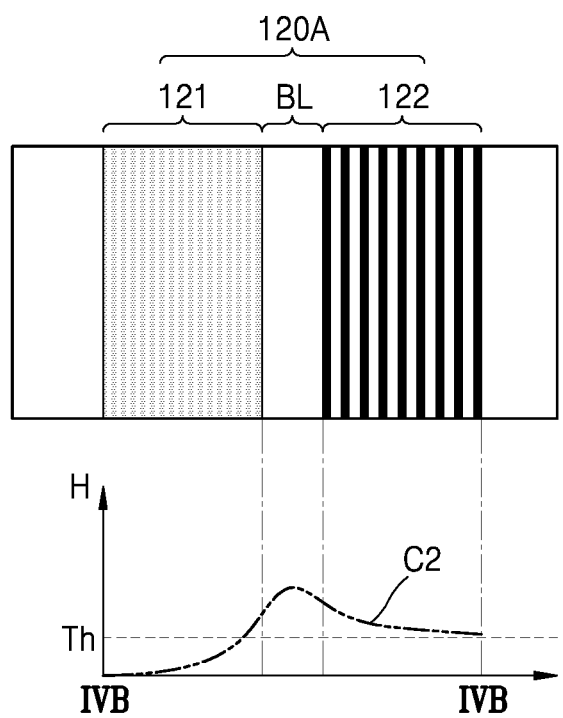
FIG. 4B is a diagram illustrating an exposure amount of a first lane along line IVB-IVB of FIG. 1.

FIG. 4B is a diagram illustrating an exposure amount of a first lane 120A along line IVB-IVB based on the second shot described above.

Figure 4C:
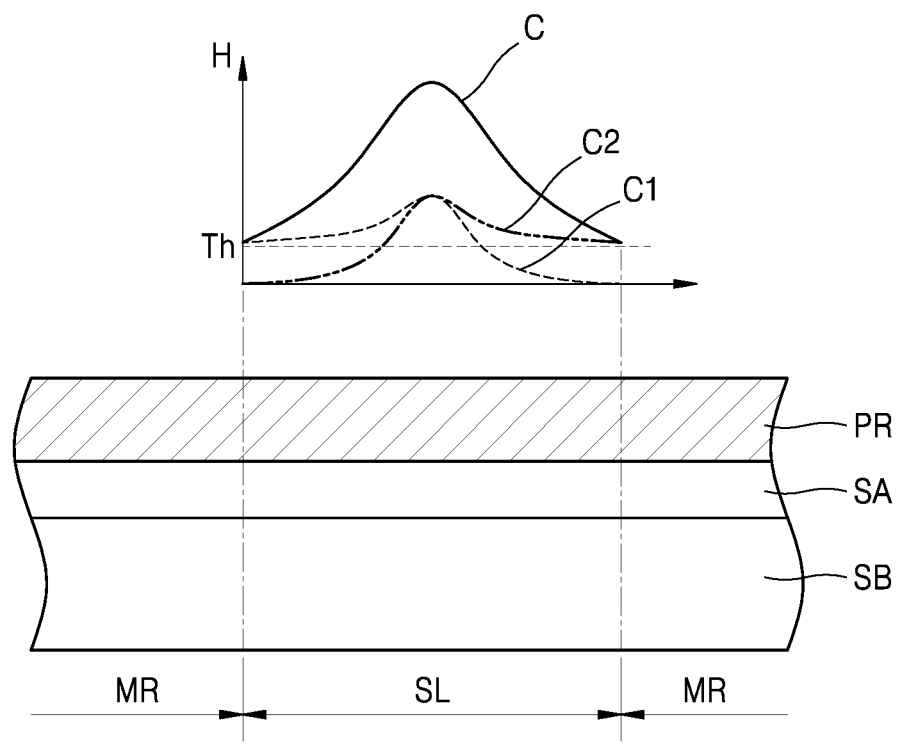
FIG. 4C is a diagram illustrating an exposure amount of a dual overlay region that is exposed twice according to an example embodiment.
Figure 4D:
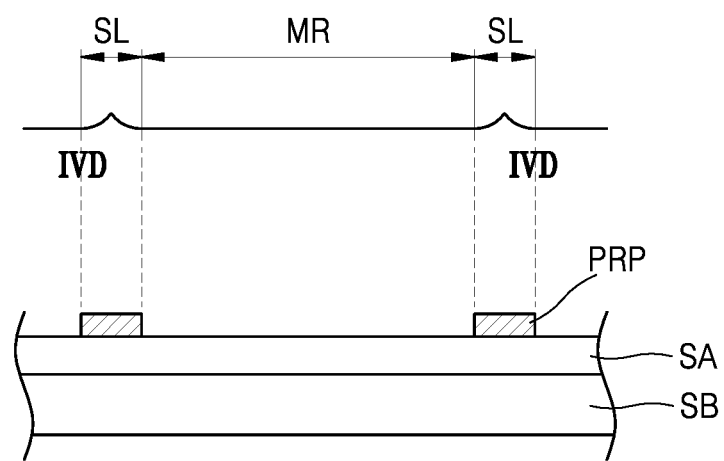
FIG. 4D is a conceptual diagram of an exposure amount along line IVD-IVD of FIG. 1 and a photoresist pattern along the line IVD-IVD of FIG. 1 according to an example embodiment.

FIG. 4C is a diagram illustrating an exposure amount of a dual overlay region (e.g., DE12 of FIG. 3) that is exposed twice according to an example embodiment. FIG. 4D is a conceptual diagram illustrating an exposure amount along line IVD-IVD of FIG. 1 and a photoresist pattern thereof.

Referring to FIGS. 3 and 4A, when the shot 1 is applied, the dual overlay region DE12 corresponding to the second lane 120B of the photomask 100, may be exposed to the light transmitting the second lane 120B. When the shot 1 is performed, because the light has difficulty transmitting through the fourth sub-lane 124, a dose of transmitted light in the fourth sub-lane 124 is 0 or close to 0. However, due to diffraction of the light transmitting through the blank region BL provided adjacent to the fourth sub-lane 124, some amount of light may be radiated to a region that is blocked by the fourth sub-lane 124 around a boundary between the blank region BL and the fourth sub-lane 124. Also, a small amount of light (an amount less than the light being transmitted through the blank region BL) may be radiated to a portion under the third sub-lane 123 due to the line-and-space pattern of the third sub-lane 123.

Thus, the dose of the light (i.e., the quantity/amount of the light) that has passed through the second lane 120B may have a distribution as illustrated by a curve C1. Here, the line-and-space pattern of the third sub-lane 123 may be adjusted so that the dose of the light transmitted through the third sub-lane 123 may exceed a predetermined threshold dose of light Th or at least may be close to the predetermined threshold dose of light Th.

Referring to FIGS. 3 and 4B, the shot 2 is applied, and the dual overlay region DE12 corresponding to the first lane 120A of the photomask 100, may be exposed, for the second time, to the light transmitting the first lane 120A. When the shot 2 is performed, because the light has difficulty transmitting through the first sub-lane 121, a dose of the transmitted light is 0 or close to 0. However, due to diffraction of the light transmitting through the blank region BL, some amount of light may be radiated to a region that is blocked by the first sub-lane 121 around a boundary between the blank region BL and the first sub-lane 121. Also, a small amount of light (an amount less than the amount transmitted through the blank region BL) may be transmitted and radiated to a portion under the second sub-lane 122 due to the line-and-space pattern of the second sub-lane 122.

Thus, the dose of the light that has passed through the first lane 120A may have a distribution as denoted by a curve C2 shown in FIG. 4B. Here, the line-and-space pattern of the second sub-lane 122 may be adjusted so that the dose/amount of the light transmitted through the second sub-lane 122 may exceed the predetermined threshold dose of light Th or at least be close to the threshold dose of light Th.

In example embodiments, the line-and-space pattern of the second sub-lane 122 may be symmetrical with the line-and-space pattern of the third sub-lane 123 with respect to the centerline of the main region MR. In example embodiments, the line-and-space pattern of the second sub-lane 122 may be identical to the line-and-space pattern of the third sub-lane 123.

In example embodiments, the dummy pattern (block pattern) of the first sub-lane 121 may be symmetrical with the dummy pattern of the fourth sub-lane 124 with respect to the centerline of the main region MR. In example embodiments, the dummy pattern of the first sub-lane 121 may be identical to the dummy pattern of the fourth sub-lane 124 instead of being symmetrical with the dummy pattern of the fourth sub-lane 124.

In an example embodiment, a width of the first sub-lane 121 may be equal to that of the second sub-lane 122. In another example embodiment, the width of the first sub-lane 121 may be different from that of the second sub-lane 122.

Referring to FIG. 4C, the dose of a light denoted by a curve C, which is a sum of the curves C1 and C2 being radiated to the second lane 120B and the first lane 120A, respectively, is applied to the dual overlay region DE12. As shown in FIG. 4C, the dose of light applied to the dual overlay region DE12 exceeds the threshold dose of light Th.

In example embodiments, as indicated by the curve C, the overall light dose radiated to the entire scribe lane region SL after performing the exposure twice may be in a range of about 105% to about 150%, about 105% to about 140%, about 105% to about 130%, or about 105% to about 125% of the threshold dose of light Th.

In the NTD, when a photoresist material layer PR is developed for patterning a target material layer SA on a substrate SB, the photoresist material layer PR is not removed but is retained on the scribe lane region SL, and the photoresist material layer PR on the main region MR may be removed or retained according to the pattern of the main region MR to be designed.

A photoresist used in the NTD may include a chemically amplified photoresist material, and an exposed portion (that is, a portion where the light of the threshold dose of light Th or greater is radiated) is retained and a non-exposed portion (that is, a portion where the light of the threshold dose of light Th or greater is not radiated) may be removed by a solvent.

It will be appreciated that, in the example embodiments, the photomask for NTD describes a photomask used in exposure of the photoresist material layer PR for patterning the photoresist material layer used in the NTD.

Referring to FIG. 4D, the light of an appropriate dose of light may be only radiated to the portion corresponding to the scribe lane region SL, and a photoresist pattern PRP provided under the scribe lane region SL may be formed to have an appropriate width. After that, an anisotropic etching and/or isotropic etching may be performed by using the photoresist pattern PRP as an etching mask to pattern a target material layer SA.

In FIGS. 4A to 4D, it is shown that the first sub-lane 121 has the dummy pattern that is a block pattern and the second sub-lane 122 has the dummy pattern that is the line-and-space pattern, but the first sub-lane 121 may have the dummy pattern that is the line-and-space pattern and the second sub-lane 122 may have the dummy pattern that is the block pattern.

FIGS. 4A to 4D illustrate the dual overlay region DE12, but the above description may be also applied to the other dual overlay regions DE13, DE24, and DE34 involving other sub-lanes.

Figure 5A:
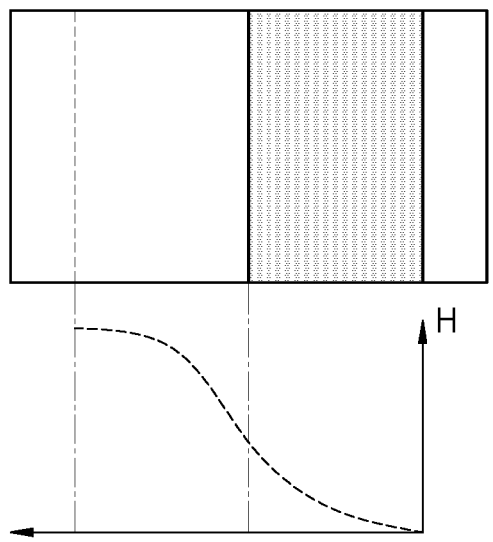
FIGS. 5A, 5B, and 5C are conceptual diagrams illustrating forming of scribe lane patterns when a sub-lane of the scribe lane has a block pattern while another sub-lane of the scribe lane is blank, without using a line-and-space pattern.
Figure 5B:
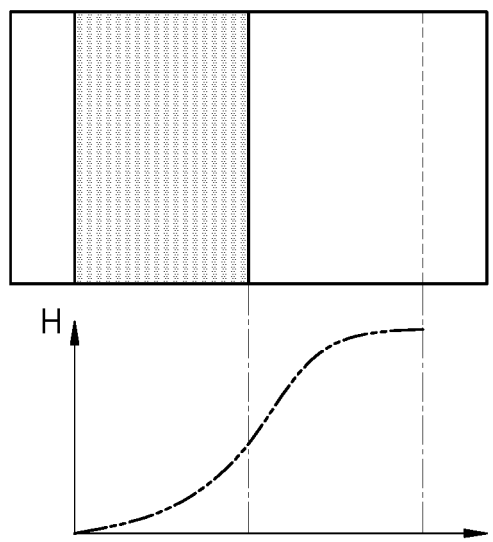
Figure 5C:
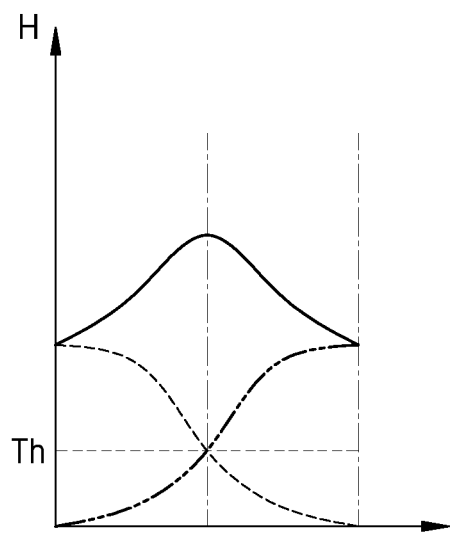

FIGS. 5A to 5C are conceptual diagrams illustrating forming of scribe lane patterns when one of the two sub-lanes has a block pattern and the other of the sub-lanes is blank without a line-and-space pattern.

FIGS. 5A and 5B are the same as FIGS. 4A and 4B, except that the line-and-space pattern of each of FIGS. 4A and 4B does not exist in the example embodiments of FIGS. 5A and 5B, and thus, differences will be described below.

Referring to FIG. 5A, because there is no line-and-space pattern in the third sub-lane 123 as in FIG. 4A, the light of an excessive dose may transmit through the third sub-lane 123 of the photomask 100 when the shot 1 is applied.

In addition, referring to FIG. 5B, because there is no line-and-space pattern in the second sub-lane 122 as in FIG. 4B, the light of an excessive dose transmits through the region corresponding to the second sub-lane 122 when the shot 2 is applied.

Referring to FIG. 5C, after the shot 1 and the shot 2 are applied, a maximum dose of the transmitted light largely exceeds the threshold dose of light Th, and even a minimum dose exceeds the threshold dose of light Th as well.

Figure 5D:
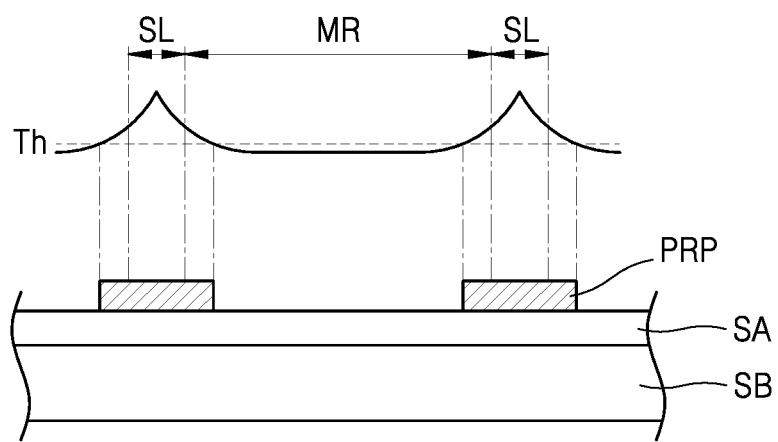
FIG. 5D is a conceptual diagram showing a distribution of light intensities according to locations when a dual overlay region is exposed twice to light as shown in FIGS. 5A and 5B.

FIG. 5D is a conceptual diagram showing a distribution of exposure amounts along the photomask 100 including the main region MR and the scribe lane region SL when an overlay region is exposed twice as shown in FIGS. 5A and 5B.

Referring to FIG. 5D, because the light exceeding the threshold dose of light Th is radiated to an outer portion of the scribe lane region SL, and thus, a photoresist pattern PRP having a width that is greater than that of the scribe lane region SL that is originally intended is obtained.

In this case, because it affects patterns of the target material layer SA under the main region MR, the mask pattern of the main region MR might have to be re-designed. In more detail, because the light that is necessary to form the target material layer SA under the scribe lane region SL is excessively radiated to the target material layer SA under the main region MR, processes of designing, trial manufacturing, and verifying the mask pattern of the main region MR for generating a cell circuit pattern or core/peri circuit pattern by trial and error, computer simulation, etc. need to be repeatedly performed taking into account the light excessively radiated to the main region MR. Therefore, it may take a long time period and costs to manufacture a photomask for manufacturing products.

However, as shown in FIG. 4D, by using the photomask for NTD according to the example embodiment, because very little amount of the light is radiated into the target material layer SA under the main region MR (i.e., outside of the scribe lane region SL), the pattern of the main region MR may be easily and simply designed and promptly applied to the manufacturing of products without intense and repetitive analysis.

Figure 6A:
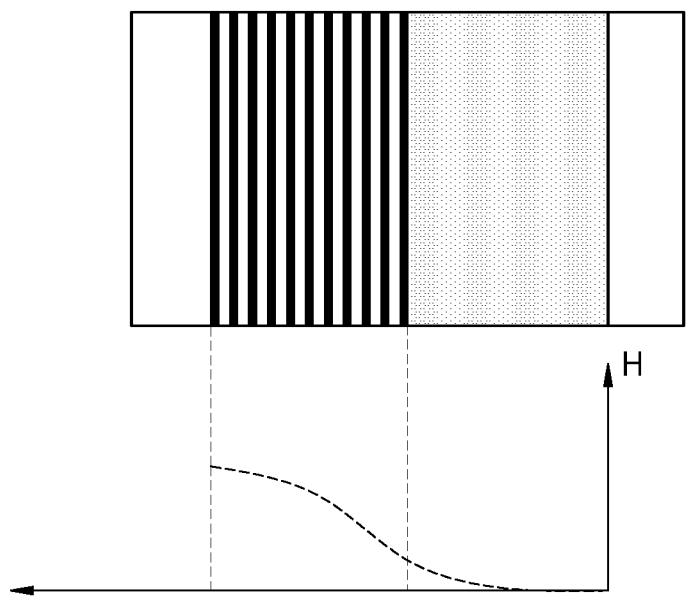
FIGS. 6A, 6B, and 6C are conceptual diagrams illustrating forming of scribe lane patterns without a blank region and a line-and-space pattern is applied to the example shown in FIGS. 5A to 5D.
Figure 6B:
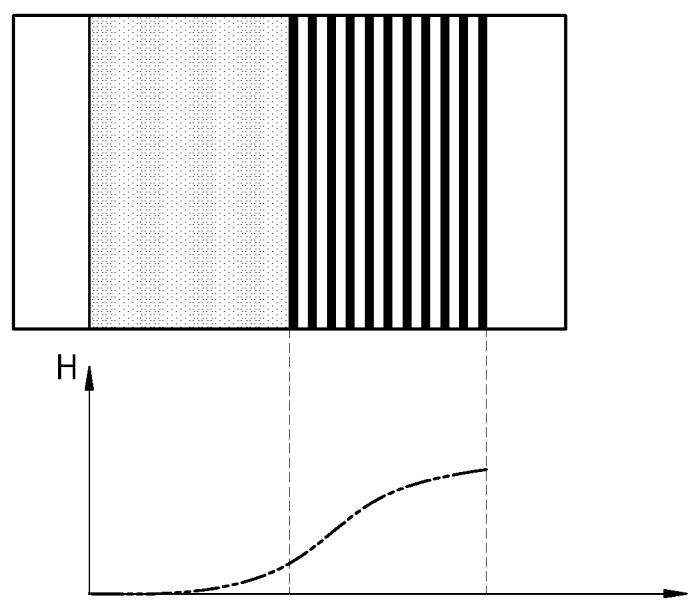
Figure 6C:
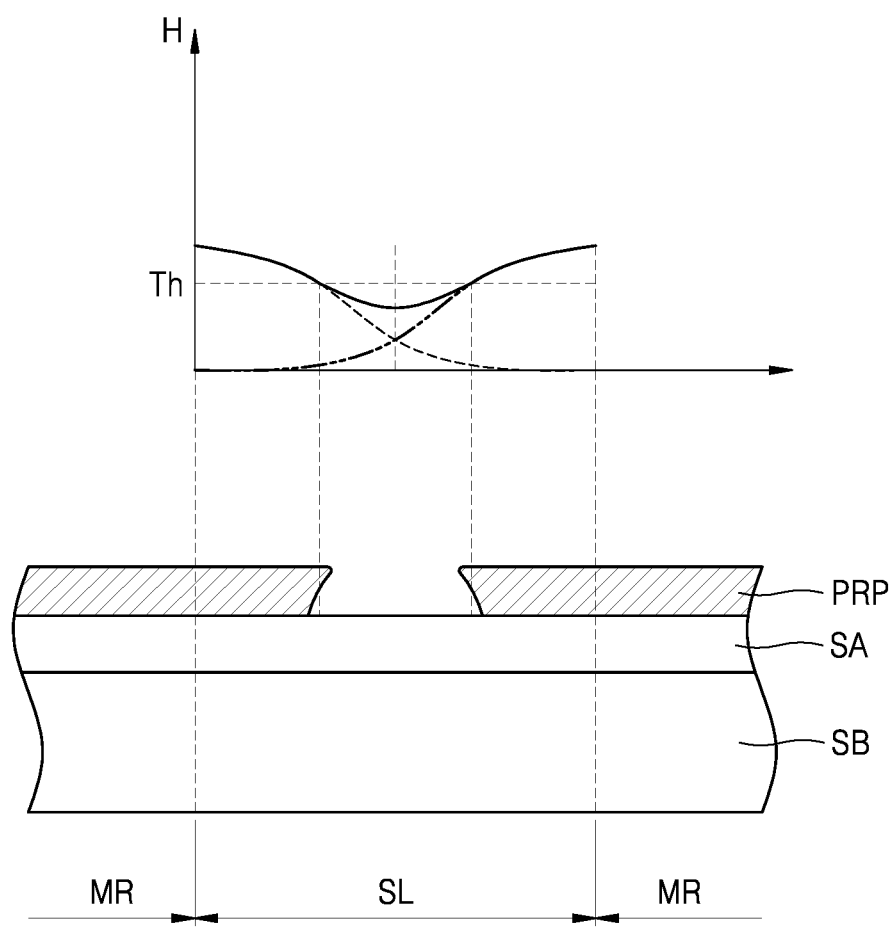

FIGS. 6A to 6C are conceptual diagrams illustrating forming of scribe lane patterns without any blank region and a line-and-space pattern is applied to the example shown in FIGS. 4A to 4D. That is, the example embodiments in FIGS. 6A to 6C incorporates the combination of a block pattern and a line-and-space pattern.

For example, the example embodiments of FIGS. 6A and 6B are the same as FIGS. 4A and 4B except that the line-and-space pattern and the block pattern are applied without having a blank region BL therebetween, and the difference will be described below.

Referring to FIG. 6A, the line-and-space pattern (on the left) is formed on the third sub-lane 123 of FIG. 4A, and because there is no blank region between the line-and-space pattern and the block pattern (on the right), the dose of the light transmitted through the region corresponding to the third sub-lane 123 may be low around a boundary between the line-and-space pattern and the block pattern when the shot 1 is performed.

In addition, referring to FIG. 6B, the line-and-space pattern is formed on a region corresponding to the second sub-lane 122 of FIG. 4B, and because there is no blank region between the line-and-space pattern and the block pattern, the dose of the light transmitted through the region corresponding to the second sub-lane 122 may be low around a boundary between the line-and-space pattern and the block pattern when the shot 2 is performed.

Referring to FIG. 6C, the overall light dose after performing the shot 1 and the shot 2 has a distribution with a concave center, and in particular, the light dose at the concave center may be less than the threshold dose of light Th. When performing NTD, a portion having a dose of the light (i.e., an amount of exposure) less than the threshold dose of light Th is removed by the solvent, and thus a photoresist pattern PRP having a defect at a center portion of the scribe lane region SL is obtained like in the photoresist pattern PRP shown in FIG. 6C.

Therefore, when the dummy pattern that is the block pattern and the dummy pattern that is the line-and-space pattern are adjacent to each other without a blank region BL therebetween in performing the NTD, an undesired photoresist pattern may be obtained.

However, as shown in FIG. 4D, when the photomask for NTD according to the example embodiment is incorporated, a sufficient dose of light may be transmitted at the center portion of the scribe lane region SL, and thus the defect as shown in FIG. 6C may not occur.

Figure 7A:
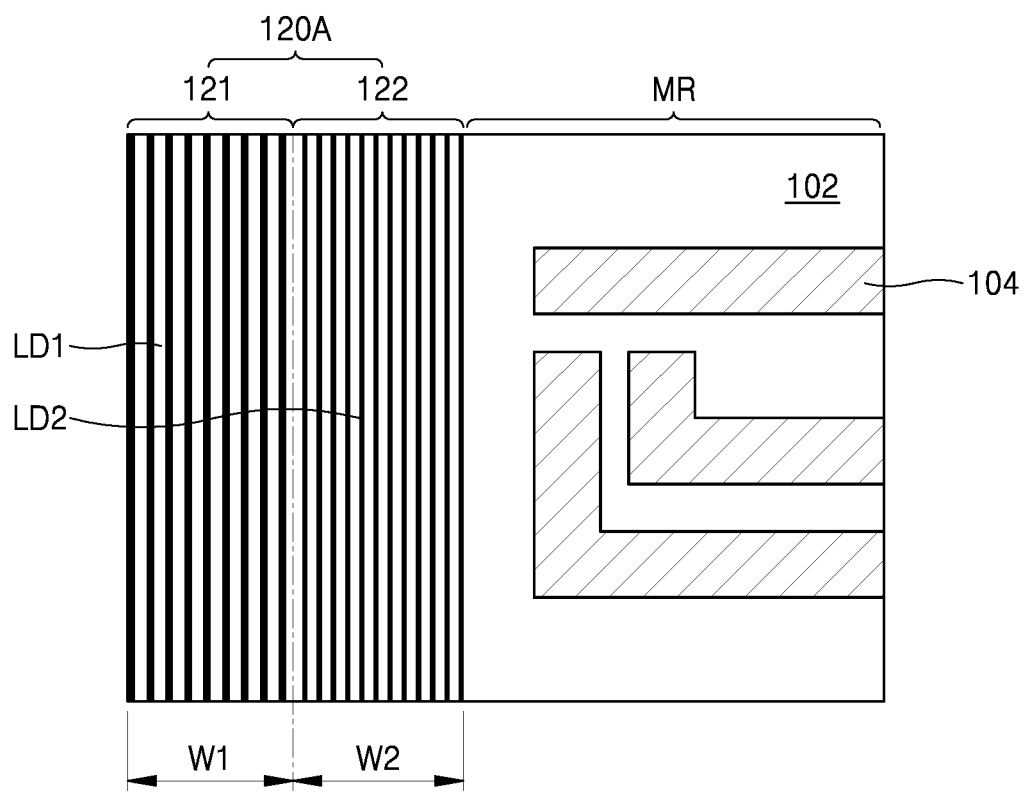
FIG. 7A is a conceptual diagram illustrating dummy patterns provided on two adjacent sub-lanes according to an example embodiment.

FIG. 7A are conceptual diagrams of a first dummy pattern LD1 and a second dummy pattern LD2 on two adjacent sub-lanes according to an example embodiment.

Referring to FIG. 7A, the first lane 120A may include the first sub-lane 121 having the first dummy pattern LD1 and the second sub-lane 122 having the second dummy pattern LD2.

Both the first dummy pattern LD1 and the second dummy pattern LD2 may be line-and-space pattern extending in a direction in which the first lane 120A extends. In example embodiments, the first dummy pattern LD1 and the second dummy pattern LD2 may be line-and-space patterns extending in a direction perpendicular to the extending direction of the first lane 120A.

The first dummy pattern LD1 and the second dummy pattern LD2 may be identical to each other or different from each other.

In example embodiments, the first dummy pattern LD1 may have a light transmittance that is relatively lower than that of the second dummy pattern LD2. The light transmittance of the first dummy pattern LD1 and the second dummy pattern LD2 may be controlled by adjusting the pitch between the lines and line widths in the line-and-space pattern.

Figure 7B:
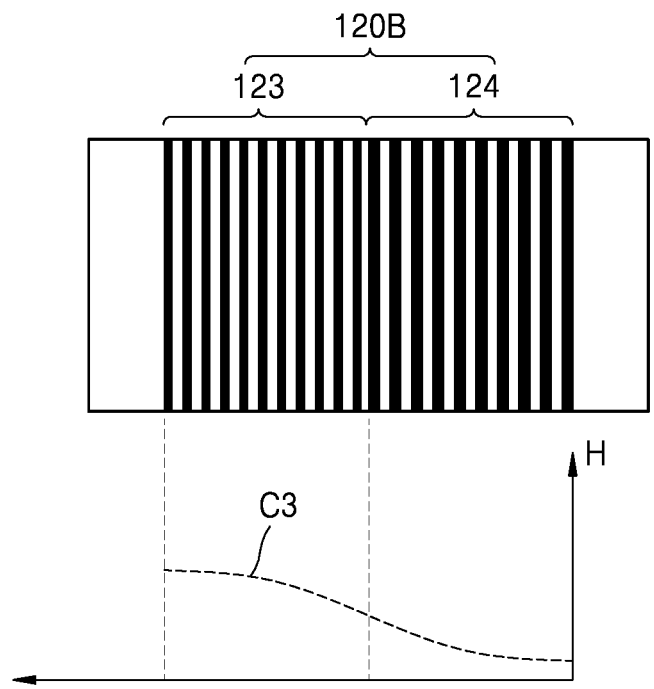
FIGS. 7B, 7C, and 7D are conceptual diagrams illustrating forming of scribe lane patterns when a dual overlay region is exposed twice by using a first sub-lane having a first dummy pattern and a second sub-lane having a second dummy pattern of FIG. 7A.
Figure 7C:
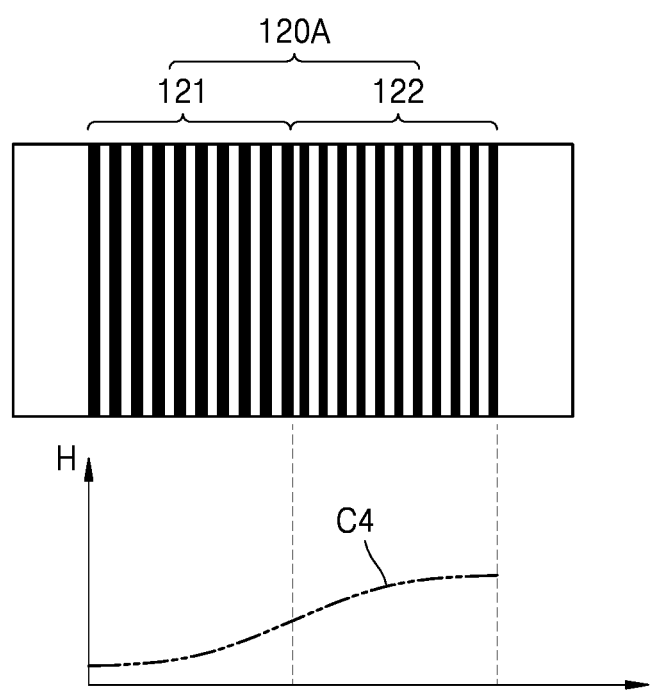
Figure 7D:
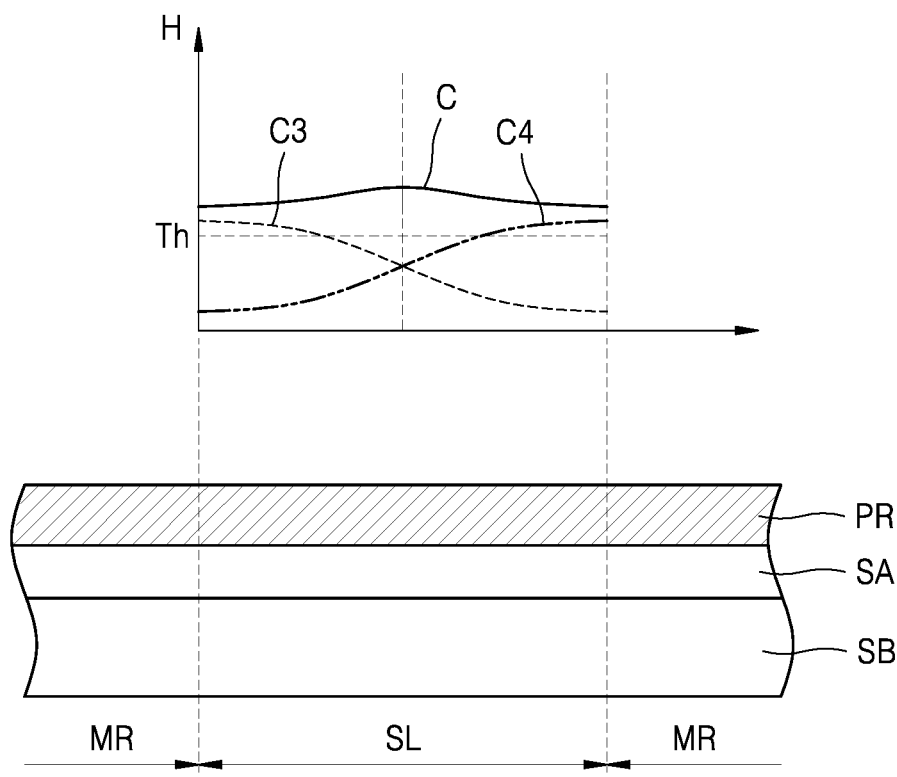

FIGS. 7B to 7D are conceptual diagrams illustrating forming of the scribe lane pattern when the dual overlay region is exposed twice by using the first sub-lane 121 having the first dummy pattern LD1 and the second sub-lane 122 having the second dummy pattern LD2 shown in FIG. 7A.

Referring to FIGS. 3 and 7B, when the shot 1 is applied, a region of the target material layer SA under the second lane 120B in the dual overlay region DE12 (see FIG. 3) may be exposed to the light transmitting through the second lane 120B. Here, it is assumed that the second lane 120B includes the third sub-lane 123 having a dummy pattern that is the same as the second dummy pattern LD2 and the fourth sub-lane 124 having a dummy pattern that is the same as the first dummy pattern LD1.

Because a light transmittance of the second dummy pattern LD2 (in the third sub-lane 123) is greater than that of the first dummy pattern LD1 (in the fourth sub-lane 124), the light transmittance through the third sub-lane 123 is relatively greater than that through the fourth sub-lane 124 when the shot 1 is performed. However, because the light transmittances of the first dummy pattern LD1 and the second dummy pattern LD2 are not largely different from each other, a variation in the light transmittance along the width of the second lane 120B may be relatively small.

Thus, the dose of the light that has passed through the second lane 120B may have a distribution as denoted by a curve C3. The intensities of the light transmitted through the third sub-lane 123 and the fourth sub-lane 124 may slightly exceed or may be slightly below the threshold dose of light Th.

Referring to FIGS. 3 and 7C, the shot 2 is performed, and a region of the target material layer SA under the first lane 120A in the dual overlay region DE12 may be exposed to the light transmitting through the first lane 120A. Because a light transmittance of the second dummy pattern LD2 (in the second sub-lane 122) is greater than that of the first dummy pattern LD1 (in the first sub-lane 121), the light transmittance through the second sub-lane 122 is relatively greater than that through the first sub-lane 121 when the shot 2 is performed. However, because the light transmittances of the first dummy pattern LD1 and the second dummy pattern LD2 are not largely different from each other, a variation in the light transmittance along the width of the first lane 120A may be relatively small.

Thus, as shown in FIG. 7C, the dose of the light that has passed through the first lane 120A may have a distribution as denoted by a curve C4. The intensities of the light transmitted through the first sub-lane 121 and the second sub-lane 122 may slightly exceed or may be slightly below the threshold dose of light Th.

Referring to FIG. 7D, the light radiated to the dual overlay region DE12 after the shot 1 and the shot 2 are performed twice is denoted as curve C. The curve C is a sum of the curve C4 which is the dose distribution of the light transmitted through the first lane 120A and the curve C3 which is the dose distribution of the light transmitted through the second lane 120B. The dose distribution of the curve C generally exceeds the threshold dose of light Th slightly and is roughly uniform in distribution along the width of the dual overlay region DE12.

Therefore, the exposed photoresist material layer may have uniform physical characteristics on the exposed scribe lane region SL and the generation of defects may be effectively prevented.

Similar to the example embodiment illustrated with reference to FIGS. 7A to 7D, the third lane 120C and the fourth lane 120D may have structures which are similar to or identical to those of the first lane 120A and the second lane 120B. In more detail, the fifth sub-lane 125 and the sixth sub-lane 126 included in the third lane 120C may the first dummy pattern LD1 and the second dummy pattern LD2, respectively. In addition, the seventh sub-lane 127 and the eighth sub-lane 128 included in the fourth lane 120D may respectively have the first dummy pattern LD1 and the second dummy pattern LD2, respectively.

In particular, a fifth dummy pattern formed in the fifth sub-lane 125 may be symmetrical with an eighth dummy pattern formed in the eighth sub-lane 128 with respect to the centerline of the main region MR. A sixth dummy pattern formed in the sixth sub-lane 126 may be symmetrical with a seventh dummy pattern formed in the seventh sub-lane 127 with respect to the centerline of the main region MR.

In example embodiments, the fifth dummy pattern formed in the fifth sub-lane 125 may be identical to the eighth dummy pattern formed in the eighth sub-lane 128. In addition, the sixth dummy pattern formed in the sixth sub-lane 126 may be identical to the seventh dummy pattern formed in the seventh sub-lane 127.

Figure 8:
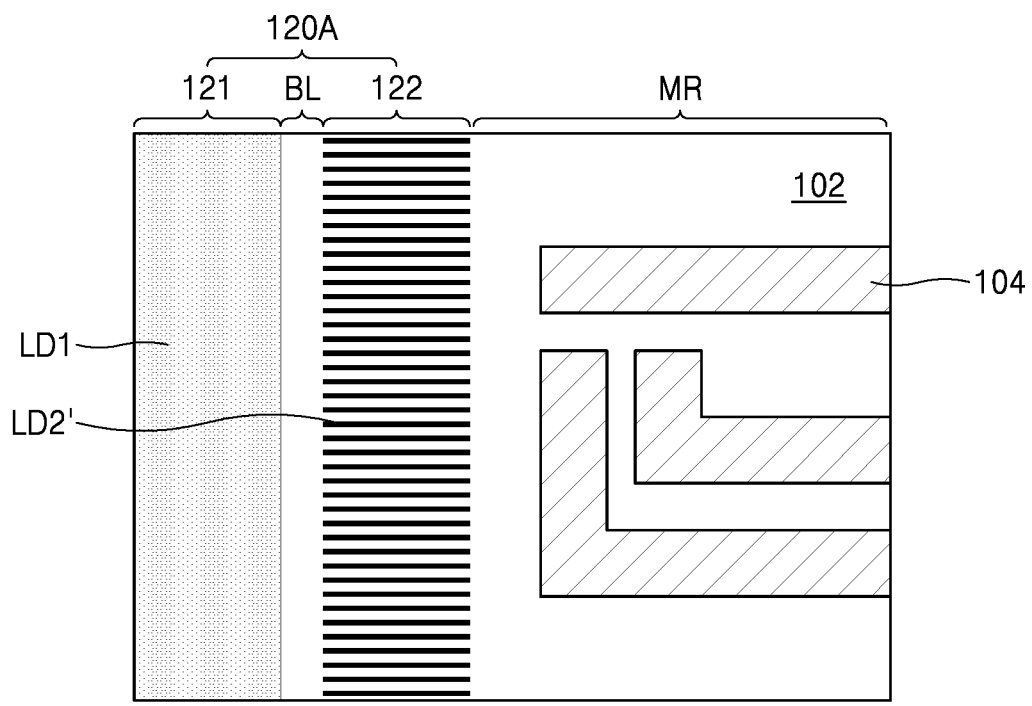
FIG. 8 is a diagram of a first lane according to an example embodiment.

FIG. 8 is a diagram of the first lane 120A according to an example embodiment. The example embodiment of FIG. 8 is different from the first lane 120A according to the embodiment shown in FIG. 2 in view of a direction in which the second dummy pattern LD2 extends, and thus, the above difference will be described below.

Referring to FIG. 8, a second dummy pattern LD2' of the second sub-lane 122 extends in a direction extending towards the main region MR. When the light is radiated to the second dummy pattern LD2' of the second sub-lane 122, a direction in which the light transmitted through the second dummy pattern LD2' is diffracted is the direction in which the second dummy pattern LD2' extends (a longitudinal (i.e., left-to-right) direction of FIG. 8), and thus influence of the light radiated (diffracted) to the main region MR from the scribe lane SL may be further reduced.

Similar to the example embodiment shown in FIG. 8, the third sub-lane 123 of the second lane 120B may also have the identical pattern as the second sub-lane 122. Moreover, one of the fifth sub-lane 125 and the sixth sub-lane 126 of the third lane 120C and one of the seventh sub-lane 127 and the eighth sub-lane 128 of the fourth lane 120D may have the line-and-space patterns extending in a direction perpendicular to the second dummy pattern LD2'.

Figure 9:
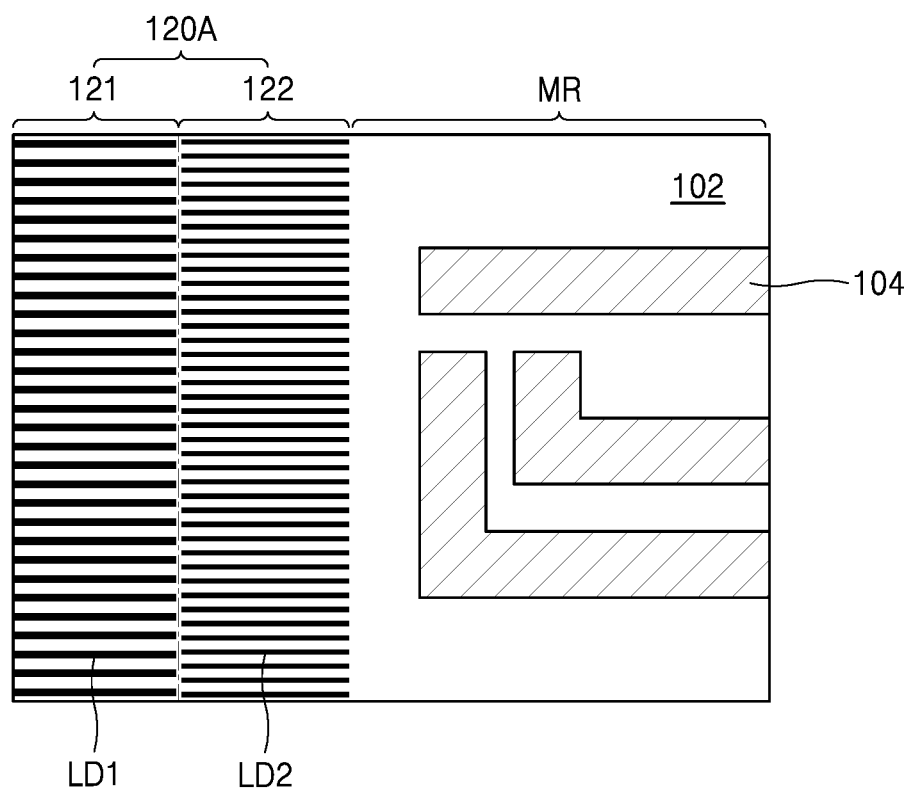
FIG. 9 is a diagram of a first lane according to an example embodiment.

FIG. 9 is a conceptual diagram of the first lane 120A according to an example embodiment. The example embodiment of FIG. 9 is different from the first lane 120A according to the example embodiment shown in FIG. 8 in view of a direction in which the first dummy pattern LD1 extends, and thus, the above difference will be described below.

Referring to FIG. 9, the first dummy pattern LD1 of the first sub-lane 121, as well as the second dummy pattern LD2 of the second sub-lane 122, extend in a direction extending towards the main region MR. Because the effects that the above structure has are already described above with reference to FIG. 8, detailed descriptions thereof are omitted.

Similar to the example embodiment shown in FIG. 9, the fourth sub-lane 124 of the second lane 120B may also have the identical pattern as the first sub-lane 121. Moreover, one of the fifth sub-lane 125 and the sixth sub-lane 126 of the third lane 120C and one of the seventh sub-lane 127 and the eighth sub-lane 128 of the fourth lane 120D may have the line-and-space patterns extending in a direction perpendicular to the first dummy pattern LD1.

Figure 10:
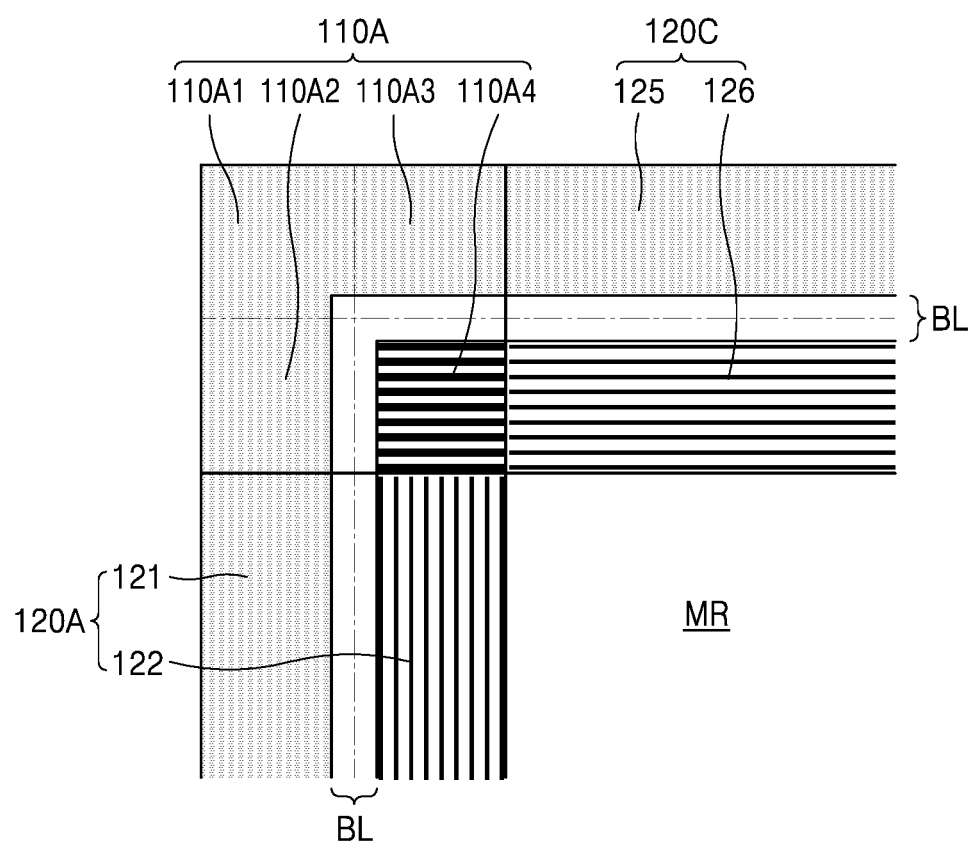
FIG. 10 is a conceptual diagram of a first corner region according to an example embodiment.

FIG. 10 is a conceptual diagram of a first corner region 110A according to an example embodiment. As described above with reference to FIG. 1, the photomask 100 for NTD according to the example embodiment may have a first corner region 110A, a second corner region 110B, a third corner region 110C, and a fourth corner region 110D at respective corners of the photomask 100. Here, the first corner region 110A will be described below, but the descriptions about the first corner region 110A may be applied to each of the second corner region 110B, the third corner region 110C, and the fourth corner region 110D.

Referring to FIG. 10, the first corner region 110A may include four zones. In detail, the first corner region 110A may include a first zone 110A1 where an extension of the first sub-lane 121 and an extension of the fifth sub-lane 125 intersect with each other, a second zone 110A2 where the extension of the first sub-lane 121 and an extension of the sixth sub-lane 126 intersect with each other, a third zone 110A3 where the extension of the second sub-lane 122 and an extension of the fifth sub-lane 125 intersect with each other, and a fourth zone 110A4 where the extension of the second sub-lane 122 and the extension of the sixth sub-lane 126 intersect with each other.

Figure 11:
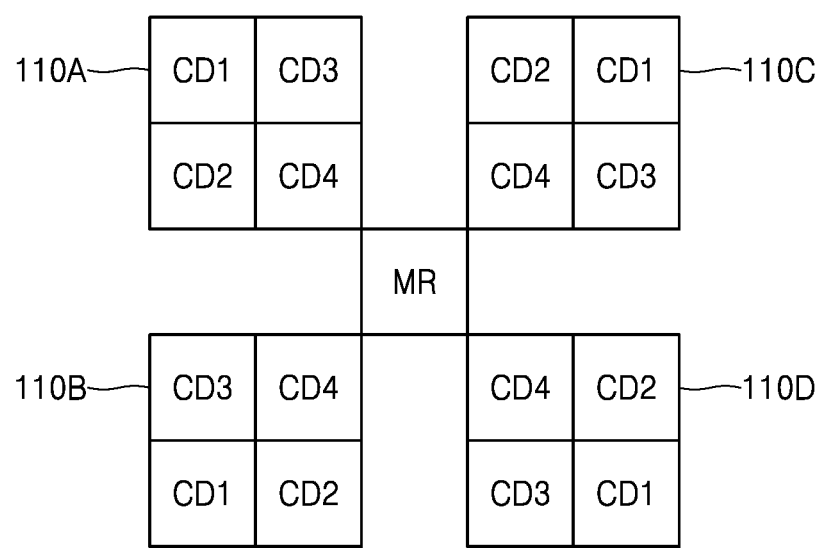
FIG. 11 is a diagram showing the arrangement of corner dummy patterns respectively included in corner regions according to an example embodiment.

FIG. 11 conceptually illustrates the arrangement of first, second, third, and fourth corner dummy patterns CD1, CD2, CD3, and CD4 included in the first, second, third, and fourth corner regions 110A, 110B, 110C, and 110D, respectively, according to an example embodiment. In FIG. 11, the size of the main region MR is exaggeratedly reduced and sizes of the first to fourth corner regions 110A to 110D are exaggeratedly enlarged for convenience of description.

Referring to FIG. 11, in each of the first, second, third, and fourth corner regions 110A, 110B, 110C and 110D, the first corner dummy pattern CD1 and the fourth corner dummy pattern CD4 are arranged in a diagonal direction with respect to each other, and the second corner dummy pattern CD2 and the third corner dummy pattern CD3 may be arranged in the opposite diagonal direction with respect to each other.

In an example embodiment, the fourth corner dummy pattern CD4 may be arranged between the first corner dummy pattern CD1 and the main region MR. In an example embodiment, the second corner dummy pattern CD2 and the third corner dummy pattern CD3 may be sequentially arranged in a clockwise direction (from CD2 to CD3) or a counter-clockwise direction (from CD3 to CD2) in the stated order.

Figure 12:
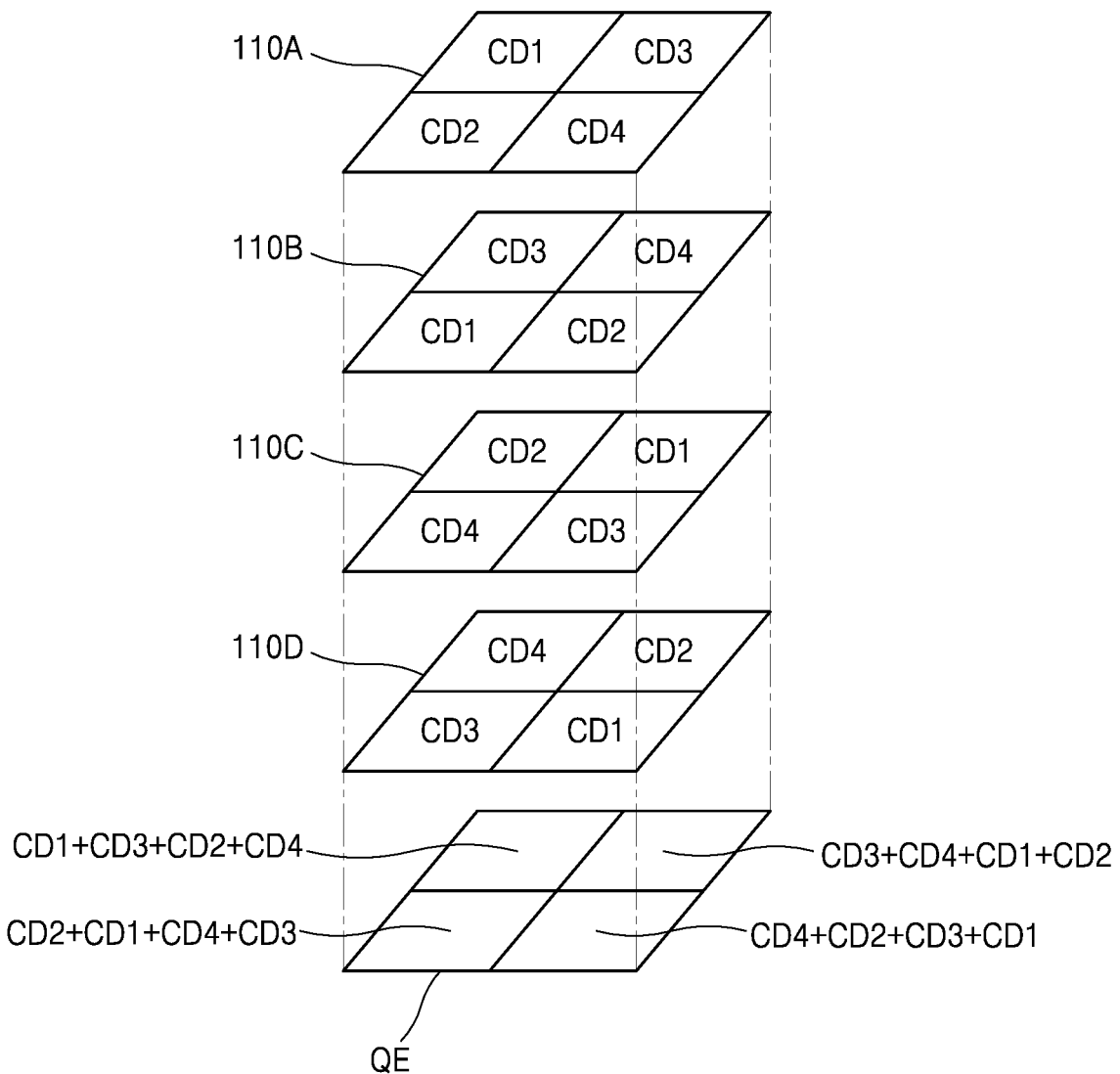
FIG. 12 is a conceptual diagram illustrating the effects of an overlay exposure obtained when corner dummy patterns are arranged in each corner region as shown in FIG. 11.

FIG. 12 is a conceptual diagram for illustrating an effect of the overlay exposure, the effect being obtained when the first, second, third and fourth corner dummy patterns CD1, CD2, CD3 and CD4 are arranged as shown in FIG. 11 in each of the first, second, third and fourth corner regions 110A, 110B, 110C and 110D.

Referring to FIGS. 3 and 12, with respect to the quadruple overlay region QE, when the shot 1 is performed, the fourth corner region 110D of shot 1 is being exposed onto the quadruple overlay region QE, when the shot 2 is performed, the third corner region 110C of shot 2 is being exposed onto the quadruple overlay region QE, when the shot 3 is performed, the second corner region 110B of shot 3 is being exposed onto the quadruple overlay region QE, and when the shot 4 is performed, the first corner region 110A of shot 4 is being exposed onto the quadruple overlay region QE.

Then, each of the first to fourth corner dummy patterns CD1, CD2, CD3 and CD4 is exposed once on each of the regions corresponding to the first to fourth zones 110A1 to 110A4 in the first corner region 110A, and then, the intensities of light radiated to the regions corresponding to the first to fourth zones 110A1 to 110A4 may be substantially equal to one another.

The dose of the light radiated to the region corresponding to the quadruple overlay region QE after the four-times exposure may exceed the threshold dose of light Th of the negative-tone photoresist at the corresponding location. In an example embodiment, after the four-times of exposure operations, the dose of the light radiated to the quadruple overlay region QE may be in a range of about 105% to about 150%, about 105% to about 140%, about 105% to about 130%, or about 105% to about 125% of the threshold dose of light Th.

Referring back to FIG. 10, the first zone 110A1, the second zone 110A2, and the third zone 110A3 may have dummy patterns that are the same as the dummy patterns of the first sub-lane 121 and the fifth sub-lane 125. For example, each of the first zone 110A1, the second zone 110A2, and the third zone 110A3 may have, but are not limited to, a block pattern, a line-and-space pattern, a chessboard pattern, a pattern of islands arranged as a lattice, or a complementary pattern of the pattern of islands arranged as a lattice.

In an example embodiment, the fourth zone 110A4 may have a dummy pattern that is identical to those of the second sub-lane 122 and the sixth sub-lane 126. For example, the fourth zone 110A4 may have, but is not limited to, a block pattern, a line-and-space pattern, a chessboard pattern, a pattern of islands arranged as a lattice, or a complementary pattern of the pattern of islands arranged as a lattice.

In an example embodiment, the fourth zone 110A4, the second sub-lane 122, and the sixth sub-lane 126 may have the line-and-space pattern as the dummy patterns. In an example embodiment, the line-and-space pattern of the fourth zone 110A4 may be different from the line-and-space patterns of the second sub-lane 122 and the sixth sub-lane 126. It is because the second sub-lane 122 and the sixth sub-lane 126 are the regions that are exposed twice, whereas the fourth zone 110A4 is the region that is exposed four times. In an example embodiment, the light transmittance of the fourth zone 110A4 may be less than those of the second sub-lane 122 and the sixth sub-lane 126.

In FIG. 10, the first sub-lane 121, the fifth sub-lane 125, the first zone 110A1, the second zone 110A2, and the third zone 110A3 have the block patterns and the second sub-lane 122, the sixth sub-lane 126, and the fourth zone 110A4 have the line-and-space patterns, or vice versa. That is, the first sub-lane 121, the fifth sub-lane 125, the first zone 110A1, the second zone 110A2, and the third zone 110A3 may have the line-and-space patterns and the second sub-lane 122, the sixth sub-lane 126, and the fourth zone 110A4 may have the block patterns.

However, the blank region BL may be arranged between the line-and-space pattern and the block pattern. As a result, the first to fourth corner regions 110A to 110D may include at least partially the blank region BL on boundaries among the first zone 110A1 to the fourth zone 110A4.

In an example embodiment, when the first sub-lane 121, the fifth sub-lane 125, the first zone 110A1, the second zone 110A2, and the third zone 110A3 have the block patterns as shown in FIG. 10, the block patterns may extend along an external edge of the entire scribe lane region SL. In addition, when the second sub-lane 122, the sixth sub-lane 126, and the fourth zone 110A4 have the line-and-space patterns as shown in FIG. 10, the line-and-space patterns may continuously extend along an internal edge of the scribe lane region SL.

Figure 13:
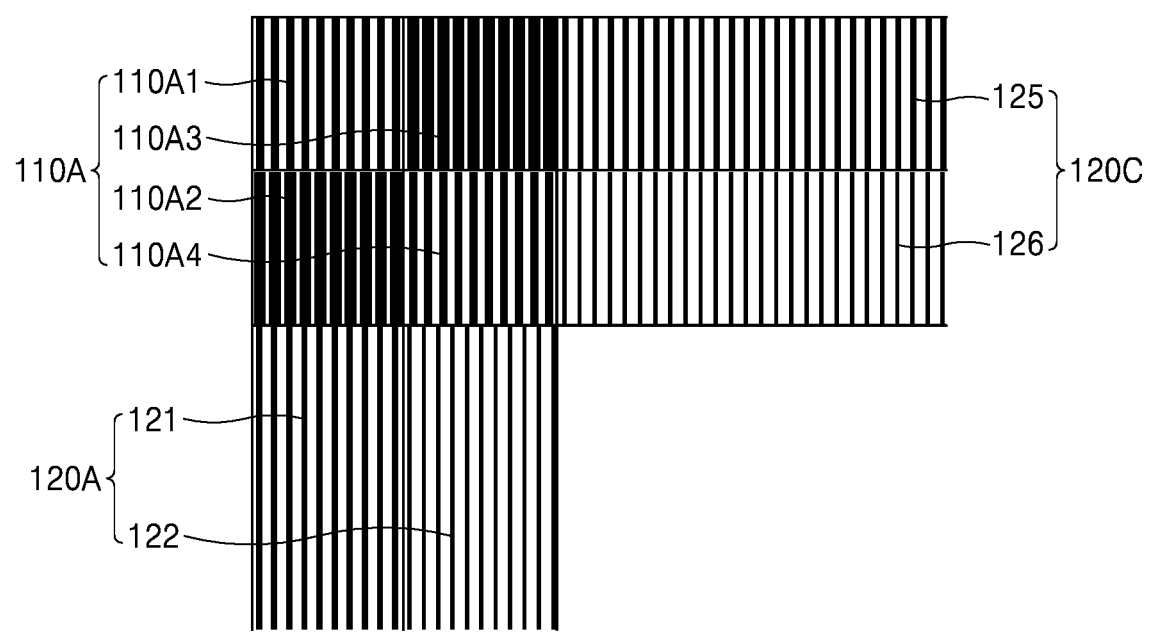
FIG. 13 is a conceptual diagram of a first corner region, a first lane, and a third lane according to an example embodiment.

FIG. 13 is a conceptual diagram of the first corner region 110A, the first lane 120A, and the third lane 120C according to an example embodiment.

Referring to FIG. 13, the first corner region 110A, the first lane 120A, and the third lane 120C may all include the line-and-space patterns.

In an example embodiment, the first sub-lane 121 and the second sub-lane 122 of the first lane 120A may have line-and-space patterns that are different from each other. In an example embodiment, the fifth sub-lane 125 and the sixth sub-lane 126 of the third lane 120C may have line-and-space patterns that are different from each other (i.e., in thickness of the line and the space). In an example embodiment, the first sub-lane 121 may have the line-and-space pattern that is identical to that of the fifth sub-lane 125. In an example embodiment, the second sub-lane 122 may have the line-and-space pattern that is the same as that of the sixth sub-lane 126.

In an example embodiment, in the first corner region 110A, four zones arranged 2×2 matrix may have the same line-and-space patterns as one another. In other example embodiments, at least one of the four zones may have a line-and-space pattern that is different from those of the others, so that all of the four zones may not have the light transmittances that are equal to one another.

In an example embodiment, the line-and-space patterns may be adjusted so that two of the four zones, which are arranged in a diagonal direction with respect to each other, may have substantially the same light transmittance as each other. For example, the first zone 110A1 may have a line-and-space pattern that is the same as that of the fourth zone 110A4. In addition, the second zone 110A2 may have a line-and-space pattern that is the same as that of the third zone 110A3.

In an example embodiment, a ratio of the light transmittance of the second sub-lane 122 with respect to that of the first sub-lane 121 may be substantially the same as a ratio of the light transmittance of the fourth zone 110A4 with respect to that of the second zone 110A2. In an example embodiment, a ratio of the light transmittance of the sixth sub-lane 126 with respect to that of the fifth sub-lane 125 may be substantially the same as a ratio of the light transmittance of the fourth zone 110A4 with respect to that of the third zone 110A3. In an example embodiment, the light transmittance of the first zone 110A1 may be adjusted so that the dose of light transmitted through the first zone 110A1 and the second zone 110A2 may be substantially the same as that of the light transmitted through the third zone 110A3 and the fourth zone 110A4.

In an example embodiment, a direction in which the line-and-space pattern of the first sub-lane 121 extends and a direction in which the line-and-space pattern of the second sub-lane 122 extends may be perpendicular to each other. In an example embodiment, a direction in which the line-and-space pattern of the fifth sub-lane 125 extends and a direction in which the line-and-space pattern of the sixth sub-lane 126 extends may be perpendicular to each other.

Figure 14:
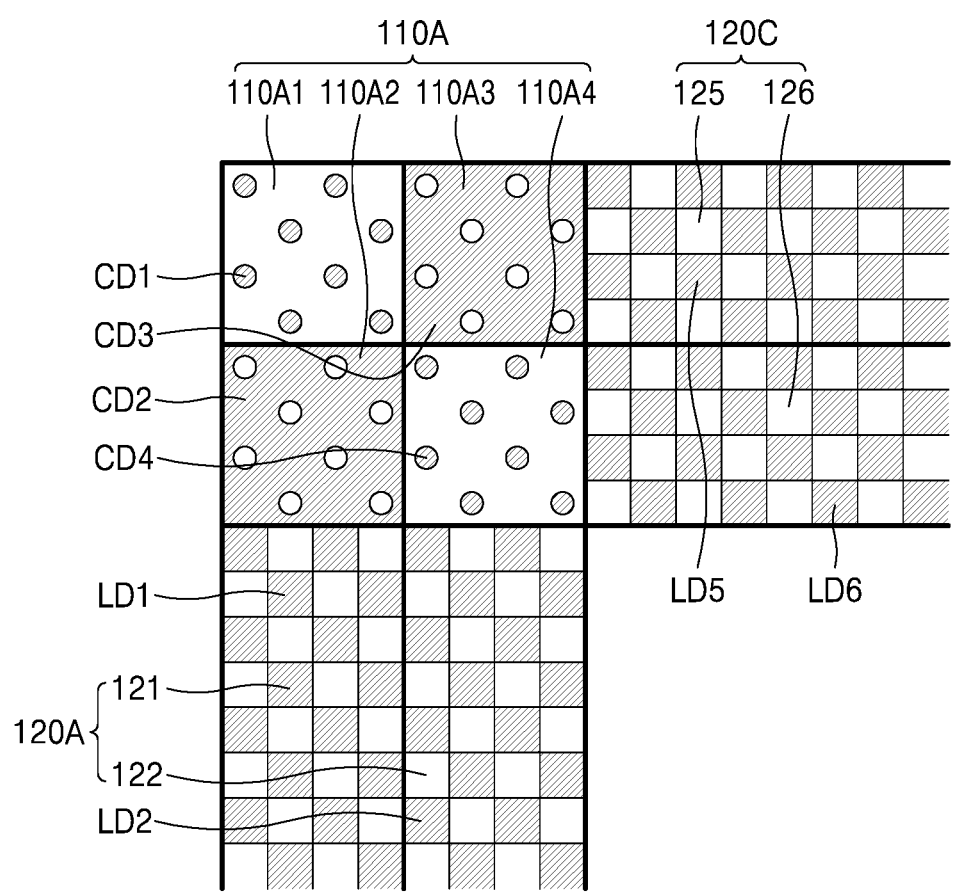
FIG. 14 is a conceptual diagram of a first corner region, a first lane, and a third lane according to an example embodiment.

FIG. 14 is a conceptual diagram of the first corner region 110A, the first lane 120A, and the third lane 120C according to an example embodiment.

Referring to FIG. 14, the first corner region 110A, the first lane 120A, and the third lane 120C may have a chessboard pattern, an island pattern, or a complementary pattern of the island pattern.

In an example embodiment, the first lane 120A and the third lane 120C may have chessboard patterns. In addition, the first corner region 110A may have an island pattern or a complementary pattern of the island pattern.

In detail, the first corner dummy pattern CD1 and the fourth corner dummy pattern CD4 of the first corner region 110A may be island patterns, and the second corner dummy pattern CD2 and the third corner dummy pattern CD4 may be complementary patterns of the island patterns.

Although not shown in FIG. 14, the second corner region 110B, the third corner region 110C, and the fourth corner region 110D may have the same structures as that of the first corner region 110A. In addition, the second lane 120B and the fourth lane 120D may have the same structures as those of the first lane 120A and the third lane 120C.

The photomask for NTD according to the example embodiments described above may be designed and manufactured rapidly with low costs and has less defects.

Figure 15:
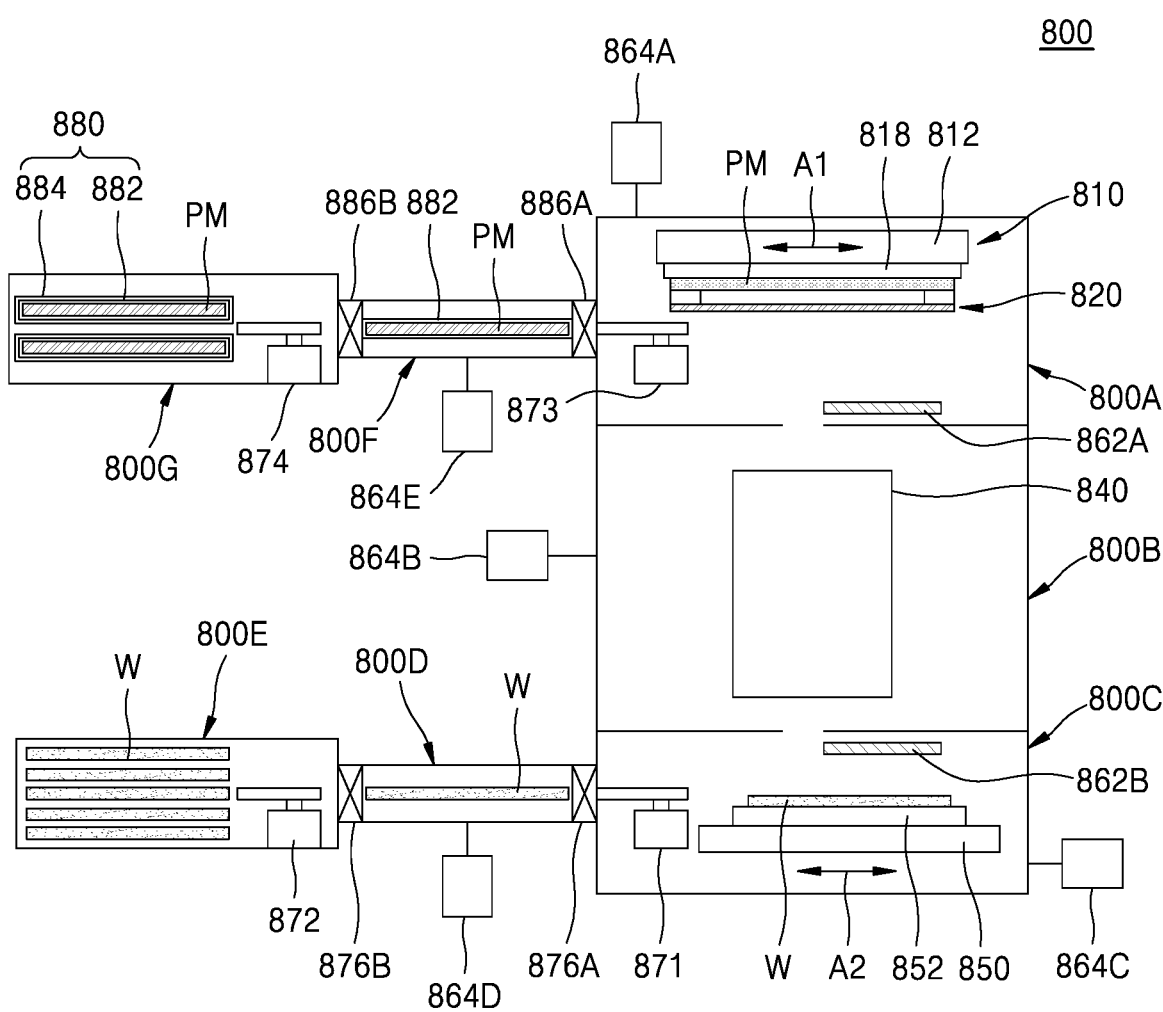
FIG. 15 is a cross-sectional view of an apparatus for manufacturing an integrated circuit device, according to an example embodiment.

FIG. 15 is a cross-sectional view of an apparatus 800 for manufacturing an integrated circuit device, according to an example embodiment. In the example embodiment of FIG. 15, the apparatus 800 includes an exposure apparatus, in which an image of a pattern designed on a photomask (or referred to as a "reticle") is transferred onto a wafer using extreme ultraviolet (EUV) light under a vacuum environment in a projection optical system.

Referring to FIG. 15, the apparatus 800 for manufacturing the integrated circuit device includes a mask stage region 800A, a projection optical system region 800B, and a wafer stage region 800C.

A mask stage 810 in the mask stage region 800A includes a mask stage supporter 812 and a mask holder system 818 fixed to the mask stage supporter 812. The mask holder system 818 fixedly supports a photomask PM. In an example embodiment, the mask holder system 818 may include an electrostatic chuck, and the mask holder system 818 may hold the photomask PM by pulling the photomask PM via an electrostatic attraction force.

A pellicle 820 may be fixed onto the photomask PM to prevent possible contamination on the photomask PM.

The mask stage 810 may transport the photomask PM supported and fixed by the mask stage supporter 812 in a scanning direction denoted by the arrow A1.

A projection optical system 840 for transferring a pattern formed in the photomask PM onto a wafer W in the wafer stage region 800C may be located in the projection optical system region 800B. The wafer W may be provided on a wafer chuck 852 on a wafer stage 850. The wafer chuck 852 may transport the wafer W in a scanning direction denoted by the arrow A2.

The mask stage region 800A in which the mask stage 810 is located, the projection optical system region 800B in which the projection optical system 840 is located, and the wafer stage region 800C in which the wafer stage 850 is located may be partitioned by gate valves 862A and 862B. Vacuum exhaust devices 864A, 864B, and 864C are respectively connected to the mask stage region 800A, the projection optical system region 800B, and the wafer stage region 800C to control pressure in the mask stage region 800A, the projection optical system region 800B, and the wafer stage region 800C independently.

A conveying hand 871 is provided to carry in or carry out the wafer W between the wafer stage region 800C and a load lock chamber 800D. A vacuum exhaust device 864D is connected to the load lock chamber 800D. The wafer W may be temporarily stored in a wafer load port 800E under atmospheric pressure. A conveying hand 872 is provided to carry in or carry out the wafer W between the load lock chamber 800D and the wafer load port 800E. A gate valve 876A is provided between the wafer stage region 800C and the load lock chamber 800D. A gate valve 876B is provided between the load lock chamber 800D and the wafer load port 800E.

A conveying hand 873 is provided to carry in or carry out the photomask PM between the mask stage 810 of the mask stage region 800A and a mask load lock chamber 800F. A vacuum exhaust device 864E is connected to the mask load lock chamber 800F. The photomask PM may be temporarily stored in a mask load port 800G under atmospheric pressure. A conveying hand 874 is provided to carry in or carry out the photomask PM between the mask load lock chamber 800F and the mask load port 800G. A gate valve 886A is inserted between the mask stage region 800A and the mask load lock chamber 800F. A gate valve 886B is inserted between the mask load lock chamber 800F and the mask load port 800G.

The photomask PM is stored and conveyed in a state of being accommodated in a photomask carrier 880 from an outer portion to the apparatus 800 for manufacturing the integrated circuit device, and the photomask PM may be carried into the mask load port 800G in a state of being accommodated in the photomask carrier 880. Accordingly, the photomask PM may not be unnecessarily exposed to an external environment and may be effectively protected against external particle contamination.

The photomask carrier 880 may include an inner pod 882 and an outer pod 884 providing a space in which the inner pod 882 is accommodated. Each of the inner pod 882 and the outer pod 884 may include a standard mechanical interface (SMIF) pod provided in accordance with a Semiconductor Equipment and Materials International (SEMI) standard (SEMI standard E152-0709). The outer pod 884 may be also referred to as a "reticle SMIF pod" and may protect the photomask PM when the photomask PM is conveyed between different manufacturing stations or between difference locations. The inner pod 882 may protect the photomask PM under a vacuum environment or when the photomask PM is conveyed to the mask stage 810 or near the mask stage 810. When an ambient environment is reduced from an atmospheric state to a vacuum state or from a vacuum state to an atmospheric state, swirling of contamination particles may be caused, and as a result, contamination particles swirling around the photomask PM may contaminate the photomask PM. The inner pod 882 protects the photomask PM against the above environment and protects the photomask PM while the photomask PM is conveyed to the vacuum environment, or the mask stage 810 or near the mask stage 810.

While example embodiments have been particularly shown and described above, it will be apparent to those skilled in the art that various modifications and variations could be made without departing from the spirit and scope of the following claims.

What is claimed is:

1. A photomask for a negative-tone development, the photomask comprising:
   a main region; and
   a scribe lane region surrounding the main region and comprising a first lane and a second lane, the first and the second lane being provided at first opposite sides of each other with respect to the main region,
   wherein the first lane comprises a first sub-lane extending in a first direction, a second sub-lane extending in the first direction, and a blank region provided between the first sub-lane and the second sub-lane,
   the first sub-lane comprises a first dummy pattern that is a block pattern,
   the second sub-lane comprises a second dummy pattern,
   the first dummy pattern is configured to block substantially all light incident upon the first sub-lane so that light incident upon substantially all of a first portion of a negative-tone photoresist provided under the first sub-lane of the photomask is below a threshold dose of light,
   the second dummy pattern is configured to transmit or radiate light so that light incident upon substantially all of a second portion of the negative-tone photoresist provided under the second sub-lane of the photomask exceeds the threshold dose of light, and
   the blank region has a width that is greater than that of a space between light blocking features of the second dummy pattern.

2. The photomask of claim 1, wherein the second lane comprises a third sub-lane and a fourth sub-lane,
   the third sub-lane and the fourth sub-lane are symmetrical with the second sub-lane and the first sub-lane, respectively, with respect to a centerline of the main region,
   the third sub-lane and the fourth sub-lane extend in the first direction,
   the third sub-lane comprises a third dummy pattern that is symmetrical with the second dummy pattern of the second sub-lane with respect to the centerline of the main region, and
   the fourth sub-lane comprises a fourth dummy pattern that is symmetrical with the block pattern of the first sub-lane with respect to the centerline of the main region.

3. The photomask of claim 2, wherein the second dummy pattern is a line-and-space pattern comprising lines that extend in a second direction perpendicular to the first direction.

4. The photomask of claim 1, wherein the second dummy pattern is a line-and-space pattern in which lines of the line-and-space pattern extend in a second direction perpendicular to the first direction.

5. The photomask of claim 1, wherein, a sum of an amount of light transmitted by the first dummy pattern and the second dummy pattern is about 105% to about 150% of the threshold dose of light.

6. The photomask of claim 1, wherein the second dummy pattern comprises a chessboard pattern, a pattern of islands arranged in a lattice configuration, or a complementary pattern of the pattern of islands arranged in the lattice configuration.

7. The photomask of claim 1, wherein the scribe lane region further comprises a third lane and a fourth lane that are provided at second opposite sides of each other with respect to the main region, the first opposite sides and the second opposite sides being perpendicular to each other,
the third lane comprises a fifth sub-lane and a sixth sub-lane that extend in a second direction that is perpendicular to the first direction,
the fourth lane comprises a seventh sub-lane and an eighth sub-lane that extend in the second direction,
the fifth sub-lane comprises a fifth dummy pattern that is the block pattern configured to block substantially all light incident upon the fifth sub-lane,
the sixth sub-lane comprises a sixth dummy pattern, and
the fifth dummy pattern and the sixth dummy pattern are configured to transmit or radiate light so that a sum of an amount of light transmitted or radiated by the fifth dummy pattern and the sixth dummy pattern exceeds the threshold dose of light.

8. The photomask of claim 7, wherein the second dummy pattern is a first line-and-space pattern extending in the first direction, and
the sixth dummy pattern is a second line-and-space pattern extending in the second direction.

9. The photomask of claim 7, wherein the scribe lane region further comprises a corner region where the first lane and the third lane intersect with each other,
the corner region comprises:
a first zone at which an extension of the first sub-lane and an extension of the fifth sub-lane intersect with each other;
a second zone at which the extension of the first sub-lane and an extension of the sixth sub-lane intersect with each other;
a third zone at which an extension of the second sub-lane and the extension of the fifth sub-lane intersect with each other; and
a fourth zone at which the extension of the second sub-lane and the extension of the sixth sub-lane intersect with each other,
the first zone comprises the block pattern configured to block substantially all light incident upon the first zone,
the second zone comprises the block pattern configured to block substantially all light incident upon the second zone a second corner dummy pattern,
the third zone comprises the block pattern configured to block substantially all light incident upon the third,
the fourth zone comprises a dummy pattern, and
a sum of light transmitted or radiated by the dummy pattern of the fourth zone exceeds the threshold dose of light.

10. The photomask of claim 9, wherein, when the light is radiated four times to be overlaid onto the negative-tone photoresist through the first zone, the second zone, the third zone, and the fourth zone, a sum of an amount of light radiated to a fourth portion of the negative-tone photoresist provided under the corner region is about 105% to about 150% of the threshold dose of light.

11. The photomask of claim 9, wherein the corner region further comprises a blank region at least partially on boundaries among the first zone, the second zone, the third zone and the fourth zone.

12. A photomask for negative-tone development, the photomask comprising:
a main region having a rectangular shape; and
a scribe lane region surrounding the main region and having a constant width,
wherein the scribe lane region comprises:
a first corner region;
a second corner region;
a third corner region;
a fourth corner region, the first corner region, the second corner region, the third corner region and the fourth corner region being adjacent to four corners of the main region, respectively;
a first sub-lane having a block pattern provided between the first corner region and the second corner region, the block pattern being configured to block substantially all light incident upon the first sub-lane so that light incident upon substantially all of a first portion of a negative-tone photoresist provided under the first sub-lane of the photomask is below a threshold dose of light;
a second sub-lane having a dummy pattern provided between the first corner region and the second corner region, the dummy pattern being configured to transmit or radiate light so that light incident upon substantially all of a second portion of the negative-tone photoresist provided under the second sub-lane of the photomask exceeds the threshold dose of light; and
a blank region provided between the first sub-lane and the second sub-lane,
wherein each of the first corner region, the second corner region, the third corner region and the fourth corner region has region light transmittance which allows light exceeding the threshold dose of light to be radiated to the negative-tone photoresist, and
the blank region has a width that is greater than that of a space between light blocking features of the dummy pattern in the second sub-lane.

13. The photomask of claim 12, wherein each of the first corner region, the second corner region, the third corner region and the fourth corner region is partitioned into four zones arranged in 2×2 matrix, and
wherein two of the four zones comprise different zone light transmittances.

14. The photomask of claim 13, wherein the four zones comprise a first zone, a second zone, a third zone and a fourth zone, and
wherein the first zone and the second zone are arranged in a diagonal direction from each other and have substantially equal light transmittances as each other.

15. The photomask of claim 14, wherein the first zone, second zone and the third zone comprise the block pattern configured to block substantially all light incident thereon, and
wherein the fourth zone comprises a line-and-space pattern.

16. The photomask of claim 12, wherein the first sub-lane and the second sub-lane extend in parallel along a first direction, and
the dummy pattern of the second sub-lane is a line-and-space comprising lines that extend in a second direction perpendicular to the first direction.

17. A photomask for negative-tone development, the photomask comprising:
a main region having a rectangular shape; and a scribe lane region surrounding the main region and having a constant width, wherein the scribe lane region comprises:
- a first dummy pattern region extending along an internal edge of the scribe lane region;
- a second dummy pattern region extending along an external edge of the scribe lane region; and
- a blank region arranged between the first dummy pattern region and the second dummy pattern region, wherein the first dummy pattern region is a line-and-space pattern and the second dummy pattern region is a block pattern configured to block substantially all light incident thereon, wherein the line-and-space pattern is configured to transmit or radiate light so that light incident upon substantially all of a first portion of a negative-tone photoresist provided under the line-and-space pattern exceeds a threshold dose of light, wherein the block pattern is configured to block substantially all light from reaching a second portion of the negative-tone photoresist provided under the block pattern of the photomask, and the blank region has a width that is greater than that of a space of the line-and-space pattern of the first dummy pattern region.

18. The photomask of claim 17, wherein the line-and-space pattern comprises a corner region and a pattern internal edge, and
wherein a first light transmittance of the corner region is less than a second light transmittance of the pattern internal edge.

19. The photomask of claim 17, wherein the first dummy pattern region and the second dummy pattern region extend in parallel along a first direction, and
the line-and-space pattern comprises lines that extend in a second direction perpendicular to the first direction.

* * * * *